(12) United States Patent
Wang et al.

(10) Patent No.: US 12,433,117 B2
(45) Date of Patent: Sep. 30, 2025

(54) DISPLAY SUBSTRATE, PREPARATION METHOD THEREFOR, AND DISPLAY APPARATUS

(71) Applicant: BOE Technology Group Co., Ltd., Beijing (CN)

(72) Inventors: Tao Wang, Beijing (CN); Tao Sun, Beijing (CN); Chengjie Qin, Beijing (CN); Ziyu Zhang, Beijing (CN); Song Zhang, Beijing (CN); Youwei Wang, Beijing (CN); Rui Hong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 656 days.

(21) Appl. No.: 17/787,604

(22) PCT Filed: Sep. 2, 2021

(86) PCT No.: PCT/CN2021/116259
§ 371 (c)(1),
(2) Date: Jun. 21, 2022

(87) PCT Pub. No.: WO2022/088978
PCT Pub. Date: May 5, 2022

(65) Prior Publication Data
US 2022/0416202 A1  Dec. 29, 2022

(30) Foreign Application Priority Data

Oct. 30, 2020 (CN) .......................... 202011187132.1

(51) Int. Cl.
*H10K 59/131* (2023.01)
*H10K 50/844* (2023.01)
(Continued)

(52) U.S. Cl.
CPC ......... *H10K 59/131* (2023.02); *H10K 50/844* (2023.02); *H10K 59/873* (2023.02); *H10K 71/00* (2023.02)

(58) Field of Classification Search
CPC ............................ H10K 50/844; H10K 71/00
See application file for complete search history.

(56) References Cited

U.S. PATENT DOCUMENTS

2010/0112270 A1   5/2010  Bulliard et al.
2021/0066656 A1*  3/2021  Kim ..................... H10K 50/844
(Continued)

FOREIGN PATENT DOCUMENTS

CN        107302014 A      10/2017
CN        110943182 A      3/2020
(Continued)

OTHER PUBLICATIONS

International Search Report for PCT/CN2021/116259 Mailed Dec. 1, 2021.
(Continued)

*Primary Examiner* — Zandra V Smith
*Assistant Examiner* — Andre C Stevenson
(74) *Attorney, Agent, or Firm* — Ling Wu; Stephen Yang; Ling and Yang Intellectual Property

(57) ABSTRACT

Provided in the present disclosure are a display substrate, a preparation method therefor, and a display apparatus. The display substrate includes a substrate, a light-emitting structure layer disposed on the substrate, and a encapsulation structure layer disposed on the light-emitting structure layer; the encapsulation structure layer includes a encapsulation layer and at least one transition layer; a side of a transition layer adjacent to the substrate makes contact with a first side film layer, and a side of a transition layer away from the substrate makes contact with a second side film layer; the
(Continued)

adhesion of the at least one transition layers is greater than that of one film layer among the first side film layer and the second side film layer, and less than that of the other film layer among the first side film layer and the second side film layer.

13 Claims, 6 Drawing Sheets

(51) Int. Cl.
*H10K 59/80* (2023.01)
*H10K 71/00* (2023.01)

(56) References Cited

U.S. PATENT DOCUMENTS

| | | | |
|---|---|---|---|
| 2021/0074955 A1* | 3/2021 | Baek | ............... H10K 50/844 |
| 2021/0143225 A1* | 5/2021 | Park | ............... G06F 3/0443 |
| 2021/0149524 A1* | 5/2021 | Bang | ............... G06F 3/0446 |
| 2021/0408481 A1 | 12/2021 | Hou | |

FOREIGN PATENT DOCUMENTS

| | | |
|---|---|---|
| CN | 111129339 A | 5/2020 |
| CN | 111129349 A | 5/2020 |
| CN | 112310318 A | 2/2021 |

OTHER PUBLICATIONS

Office Action dated Dec. 13, 2021 for Chinese Patent Application No. 202011187132.1 and English Translation.
Office Action dated Aug. 10, 2022 for Chinese Patent Application No. 202011187132.1 and English Translation.

* cited by examiner

DISPLAY SUBSTRATE, PREPARATION METHOD THEREFOR, AND DISPLAY APPARATUS

CROSS-REFERENCE TO RELATED APPLICATIONS

The present application is a U.S. National Phase Entry of International Application No. PCT/CN2021/116259 having an international filing date of Sep. 2, 2021, which claims priority of Chinese Patent Application No. 202011187132.1 filed to the CNIPA on Oct. 30, 2020, entitled "Display Substrate and Preparation Method Therefor, and Display Apparatus". The above-identified applications are hereby incorporated by reference.

TECHNICAL FIELD

The present disclosure relates to, but is not limited to, the field of display technology, and more particularly, to a display substrate and a preparation method therefor, and a display apparatus.

BACKGROUND

An Organic Light Emitting Diode (OLED) is an active light emitting display apparatus, which has the advantages of auto-luminescence, wide angle of view, high contrast, low power consumption, extremely high response speed, lightness and thinness, bendability, low cost, etc. With constant development of display technologies, a Flexible Display using an OLED as a light emitting device and performing signal control by use of a Thin Film Transistor (TFT for short) has become a mainstream product in the field of display at present.

As water and oxygen from outside air invade the light-emitting device, organic light emitting materials will be eroded by water and oxygen, and oxidation reactions will occur, which will cause pixels to shrink or not emit light, and the performance of the device will deteriorate, thereby affecting the service life of the display device. Therefore, OLEDs based on organic materials have very high requirements for encapsulation. At present, flexible OLED is usually encapsulated by thin film. Although the thin film encapsulation is light and easy to bend, the encapsulation film of thin film encapsulation has problems such as interface peeling, which reduces the yield and service life.

SUMMARY

The following is a summary of subject matters described herein in detail. The summary is not intended to limit the protection scope of the claims.

The present disclosure provides a display substrate including a substrate, an emitting structure layer disposed on the substrate, and a encapsulation structure layer disposed on a side of the emitting structure layer away from the substrate; the encapsulation structure layer includes an encapsulation layer and at least one transition layer, a side of the transition layer adjacent to the substrate is in contact with a first side film layer, the side of the transition layer away from the substrate is in contact with a second side film layer, and the adhesion of the at least one transition layer is greater than the adhesion of one of the first side film layer and the second side film layer and less than the adhesion of the other of the first side film layer and the second side film layer.

In an exemplary embodiment, the encapsulation structure layer includes a first encapsulation layer, a second encapsulation layer and a third encapsulation layer arranged in sequence along a direction away from the substrate, the transition layer includes any one or more of the following: a first transition layer, a second transition layer and a third transition layer, the first transition layer is arranged between a cathode of the emitting structure layer and the first encapsulation layer, the second transition layer is arranged between the first encapsulation layer and the second encapsulation layer, and the third transition layer is arranged between the second encapsulation layer and the third encapsulation layer.

In an exemplary embodiment, the adhesion of the first transition layer is greater than the adhesion of the cathode of the emitting structure layer, and the adhesion of the first transition layer is smaller than the adhesion of the first encapsulation layer.

In an exemplary embodiment, the adhesion of the second transition layer is greater than the adhesion of the first encapsulation layer, and the adhesion of the second transition layer is less than the adhesion of the second encapsulation layer.

In an exemplary embodiment, the adhesion of the third transition layer is less than the adhesion of the second encapsulation layer, and the adhesion of the third transition layer is greater than the adhesion of the third encapsulation layer.

In an exemplary embodiment, the first transition layer includes a first sub-transition layer and a second sub-transition layer, and the first encapsulation layer includes a first water barrier layer;

the first sub-transition layer is disposed on a side of the cathode of the emitting structure layer away from the substrate, and the adhesion of the first sub-transition layer is greater than the adhesion of the cathode of the emitting structure layer; the second sub-transition layer is disposed on a side of the first sub-transition layer away from the substrate, and the adhesion of the second sub-transition layer is greater than the adhesion of the first sub-transition layer; the first water barrier layer is disposed on a side of the second sub-transition layer away from the substrate, and the adhesion of the first water barrier layer is greater than the adhesion of the second sub-transition layer.

In an exemplary embodiment, the first transition layer includes a first sub-transition layer and a second sub-transition layer, and the first encapsulation layer includes a first sub-water blocking layer and a second sub-water barrier layer;

the first sub-transition layer is disposed on a side of the cathode of the emitting structure layer away from the substrate, and the adhesion of the first sub-transition layer is greater than the adhesion of the cathode of the emitting structure layer; the first sub-water barrier layer is disposed on a side of the first sub-transition layer away from the substrate, and the adhesion of the first sub-water barrier layer is greater than the adhesion of the first sub-transition layer; the second sub-transition layer is disposed on a side of the first sub-water barrier layer away from the substrate; the second sub-water barrier layer is disposed on a side of the second sub-transition layer away from the substrate, and the adhesion of the second sub-water barrier layer is greater than the adhesion of the second sub-transition layer.

In an exemplary embodiment, the density of the first sub-transition layer is less than the density of the first sub-water barrier layer; or, the modulus of the first sub-transition layer is less than the modulus of the first sub-water barrier layer; or, the hardness of the first sub-transition layer is less than the hardness of the first sub-water barrier layer.

The present disclosure further provides a display apparatus, which includes the aforementioned display substrate.

The present disclosure further provides a method for manufacturing a display substrate, which includes:

forming an emitting structure layer on a substrate;

forming an encapsulation structure layer on the emitting structure layer, wherein the encapsulation structure layer includes an encapsulation layer and at least one transition layer, a side of the transition layer adjacent to the substrate is in contact with a first side film layer, the side of the transition layer away from the substrate is in contact with a second side film layer, and the adhesion of the at least one transition layer is greater than the adhesion of one of the first side film layer and the second side film layer and less than the adhesion of the other of the first side film layer and the second side film layer.

In the exemplary embodiment, forming an encapsulation structure layer on the emitting structure layer includes:

forming a first transition layer on a cathode of the emitting structure layer, wherein the adhesion of the first transition layer is greater than the adhesion of the cathode of the emitting structure layer; forming a first encapsulation layer on the first transition layer, wherein the adhesion of the first encapsulation layer is greater than the adhesion of the first transition layer; forming a second encapsulation layer and a third encapsulation layer in sequence on the first encapsulation layer; or, forming a first encapsulation layer on the cathode of the emitting structure layer; forming a second transition layer on the first encapsulation layer, wherein the adhesion of the second transition layer is greater than the adhesion of the first encapsulation layer; sequentially forming a second encapsulation layer and a third encapsulation layer on the second transition layer, wherein the adhesion of the second encapsulation layer is greater than the adhesion of the second transition layer; or, sequentially forming a first encapsulation layer and a second encapsulation layer on the cathode of the emitting structure layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer; or, forming a first transition layer on a cathode of the emitting structure layer, wherein the adhesion of the first transition layer is greater than the adhesion of the cathode of the emitting structure layer; forming a first encapsulation layer on the first transition layer, wherein the adhesion of the first encapsulation layer is greater than the adhesion of the first transition layer; forming a second transition layer on the first encapsulation layer, wherein the adhesion of the second transition layer is greater than the adhesion of the first encapsulation layer; sequentially forming a second encapsulation layer and a third encapsulation layer on the second transition layer, wherein the adhesion of the second encapsulation layer is greater than the adhesion of the second transition layer; or, forming a first transition layer on a cathode of the emitting structure layer, wherein the adhesion of the first transition layer is greater than the adhesion of the cathode of the emitting structure layer; sequentially forming a first encapsulation layer and a second encapsulation layer on the first transition layer, wherein the adhesion of the first encapsulation layer is greater than the adhesion of the first transition layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer; or, forming a first encapsulation layer on the cathode of the emitting structure layer; forming a second transition layer on the first encapsulation layer, wherein the adhesion of the second transition layer is greater than the adhesion of the first encapsulation layer; forming a second encapsulation layer on the second transition layer, wherein the adhesion of the second encapsulation layer is greater than the adhesion of the second transition layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer; or, forming a first transition layer on a cathode of the emitting structure layer, wherein the adhesion of the first transition layer is greater than the adhesion of the cathode of the emitting structure layer; forming a first encapsulation layer on the first transition layer, wherein the adhesion of the first encapsulation layer is greater than the adhesion of the first transition layer; forming a second transition layer on the first encapsulation layer, wherein the adhesion of the second transition layer is greater than the adhesion of the first encapsulation layer; forming a second encapsulation layer on the second transition layer, wherein the adhesion of the second encapsulation layer is greater than the adhesion of the second transition layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer.

In an exemplary embodiment, the first transition layer includes a first sub-transition layer and a second sub-transition layer, and the first encapsulation layer includes a first water barrier layer; the forming of a first transition layer and a first encapsulation layer on the cathode of the emitting structure layer includes:

forming a first sub-transition layer on a cathode of the emitting structure layer, wherein the adhesion of the first sub-transition layer is greater than the adhesion of the cathode of the emitting structure layer;

forming a second sub-transition layer on the first sub-transition layer, wherein the adhesion of the second sub-transition layer is greater than the adhesion of the first sub-transition layer;

forming a first water barrier layer on the second sub-transition layer, wherein the adhesion of the first water barrier layer is greater than the adhesion of the second sub-transition layer.

In an exemplary embodiment, the first transition layer includes a first sub-transition layer and a second sub-transition layer, and the first encapsulation layer includes a first sub-water barrier layer and a second sub-water barrier layer; the forming of a first transition layer and a first encapsulation layer on the cathode of the emitting structure layer includes:

forming a first sub-transition layer on a cathode of the emitting structure layer, wherein the adhesion of the first sub-transition layer is greater than the adhesion of the cathode of the emitting structure layer;

forming a first sub-water barrier layer on the first sub-transition layer, wherein the adhesion of the first sub-water barrier layer is greater the adhesion of the first sub-transition layer;

forming a second sub-transition layer on the first sub-water barrier layer; and forming a second sub-water barrier layer on the second sub-transition layer, wherein the adhesion of the second sub-water barrier layer is greater than the adhesion of the second sub-transition layer.

In an exemplary embodiment, the density of the first sub-transition layer is less than the density of the first sub-water barrier layer; or, the modulus of the first sub-transition layer is less than the modulus of the first sub-water barrier layer; or, the hardness of the first sub-transition layer is less than the hardness of the first sub-water barrier layer.

After reading and understanding the drawings and the detailed description, other aspects may be understood.

BRIEF DESCRIPTION OF DRAWINGS

Accompanying drawings are used for providing further understanding for the technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, and are only intended to schematically illustrate contents of the present disclosure.

Figure 1:
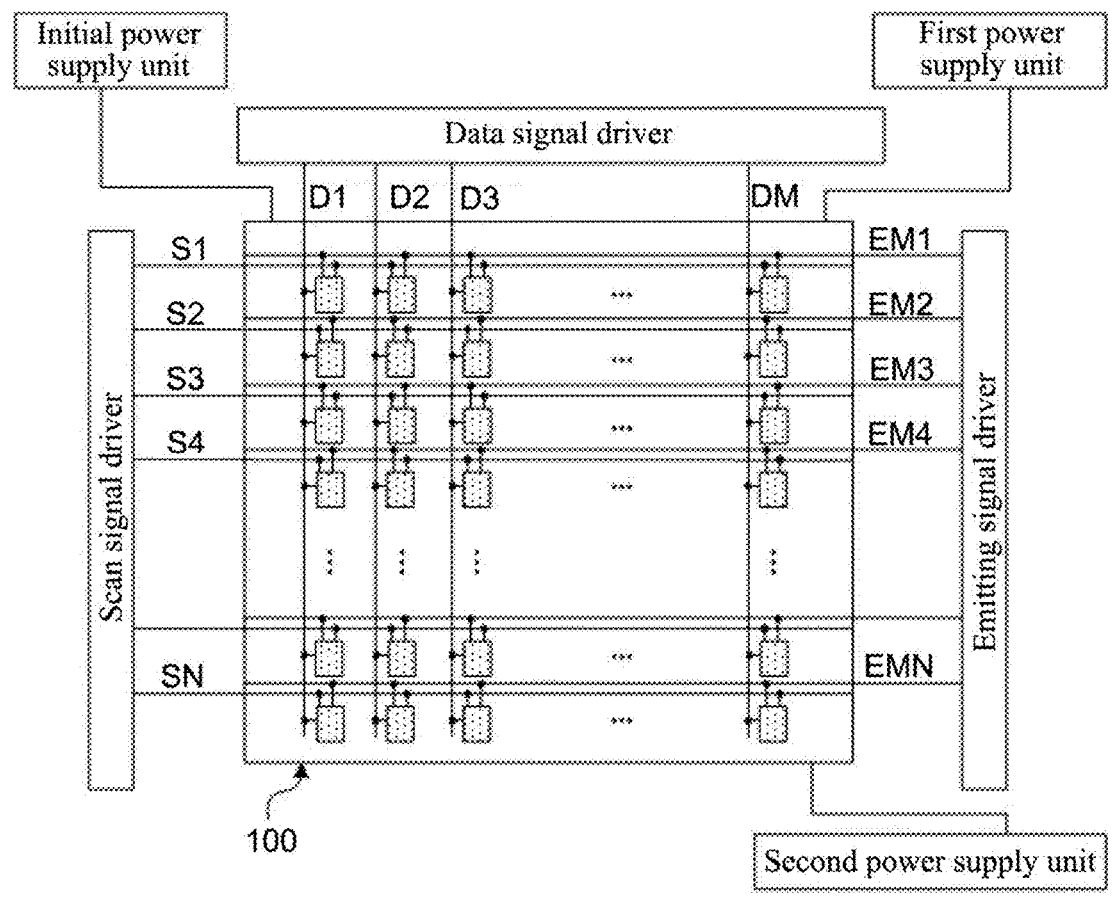
FIG. 1 is a schematic diagram of a structure of an Organic Light Emitting Diode (OLED) display apparatus.

DESCRIPTION OF REFERENCE SIGNS 1-glass carrier plate; 10-substrate; 20-drive circuit layer; 30-light emitting device; 40-encapsulation structure layer
50-first composite encapsulation layer;
51-first water barrier layer; 51-1-first sub-water barrier layer; 51-2-second sub-water barrier layer;
60-second composite encapsulation layer; 61-second transition layer; 62-first organic layer;
70-third composite encapsulation layer; 71-third transition layer; 72-third water barrier
81-first transition layer; 81-1-first sub-transition layer; 81-2-second sub-transition layer;
100-OLED display substrate; 101-first transistor; 102-storage capacitor.

DETAILED DESCRIPTION

To make objectives, technical solutions, and advantages of the present disclosure clearer, the embodiments of the present disclosure will be described in detail with reference to the accompanying drawings. It is to be noted that embodiments may be implemented in a plurality of different forms. Those of ordinary skills in the art may easily understand such a fact that embodiments and contents may be transformed into various forms without departing from the purpose and scope of the present disclosure. Therefore, the present disclosure should not be explained as being limited to contents described in following embodiments only. The embodiments in the present disclosure and features in the embodiments may be combined randomly with each other if there is no conflict.

In the drawings, a size of each constituent element, and a thickness of a layer or a region are exaggerated sometimes for clarity. Therefore, an embodiment of the present disclosure is not necessarily limited to the size, and shapes and sizes of various components in the drawings do not reflect actual scales. In addition, the drawings schematically illustrate ideal examples, and an embodiment of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions according to which the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

FIG. 1 is a schematic diagram of a structure of an OLED display apparatus. As shown in FIG. 1, the OLED display apparatus may include a scan signal driver, a data signal driver, an emitting signal driver, an OLED display substrate 100, a first power supply unit, a second power supply unit and an initial power supply unit. In an exemplary embodiment, the OLED display substrate at least includes a plurality of scan signal lines (S1 to SN), a plurality of data signal lines (D1 to DM) and a plurality of emitting signal lines (EM1 to EMN); the scan signal driver is configured to sequentially supply scan signals to the plurality of scan signal lines (S1 to SN), the data signal driver is configured to supply data signals to the plurality of data signal lines (D1 to DM), and the emitting signal driver is configured to sequentially supply emitting control signals to the plurality of emitting signal lines (EM1 to EMN). In an exemplary embodiment, the plurality of scan signal lines and the plurality of emitting signal lines extend along a horizontal direction, and the plurality of data signal lines extend along a vertical direction. The display apparatus includes a plurality of sub-pixels, and at least one sub-pixel includes a pixel drive circuit and a light emitting device. The pixel drive circuit is respectively connected to a scan signal line, a data signal line and an emitting signal line, and the pixel drive circuit may include a plurality of transistors and storage capacitors, The pixel drive circuit is configured to, under control of the scan signal line and the emitting signal line, receive a data voltage transmitted by the data signal line and output a corresponding current to the light emitting device, and the light emitting device is configured to emit light with a corresponding brightness in response to the current output by the pixel drive circuit of the sub-pixel where the light emitting device is located. The first power supply unit, the second power supply unit and the initial power supply unit are respectively configured to provide a first power supply voltage, a second power supply voltage and an initial power supply voltage to the pixel drive circuit through the first power supply line, the second power supply line and the initial signal line.

Figure 2:
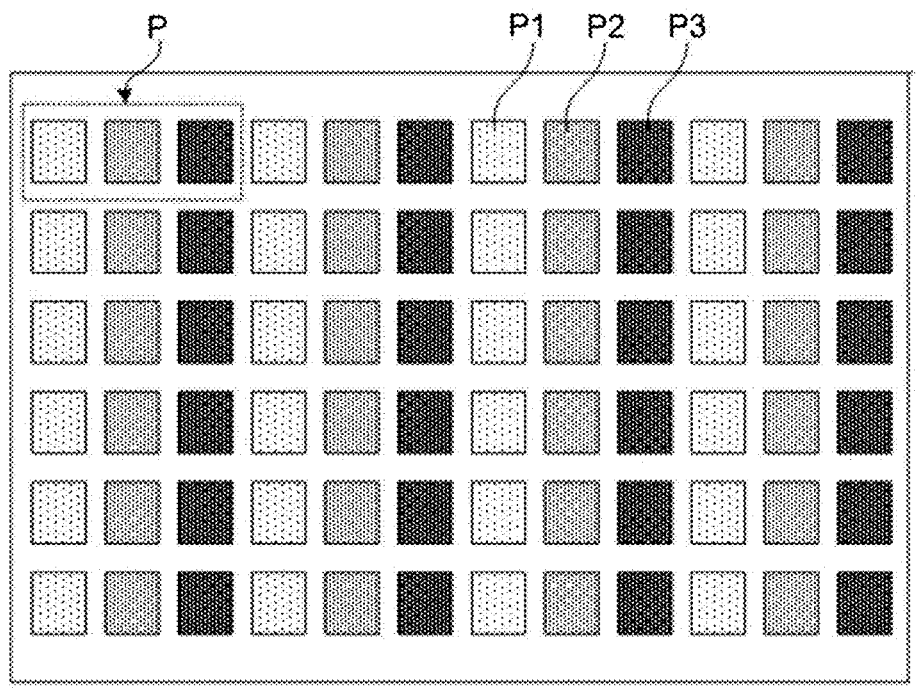
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix. At least one of the plurality of pixel units P includes a first sub-pixel P1 emitting light of a first color, a second sub-pixel P2 emitting light of a second color and a third sub-pixel P3 emitting light of a third color. In an exemplary implementation, the pixel unit P may include a red (R) sub-pixel, a green (G) sub-pixel and a blue (B) sub-pixel, or may include a red sub-pixel, a green sub-pixel, a blue sub-pixel and a white (W) sub-pixel, which is not limited in the present disclosure. In an exemplary implementation, the shape of the sub-pixel in the pixel unit may be a rectangle, a rhombus, a pentagon or a hexagon. When the pixel unit includes three sub-pixels, the three sub-pixels may be arranged side by side horizontally, side by side vertically, or in a form of delta, and when the pixel unit includes four sub-pixels, the four sub-pixels may be arranged side by side horizontally, side by side vertically, or in a shape of a square, which is not limited in the present disclosure.

Figure 3:
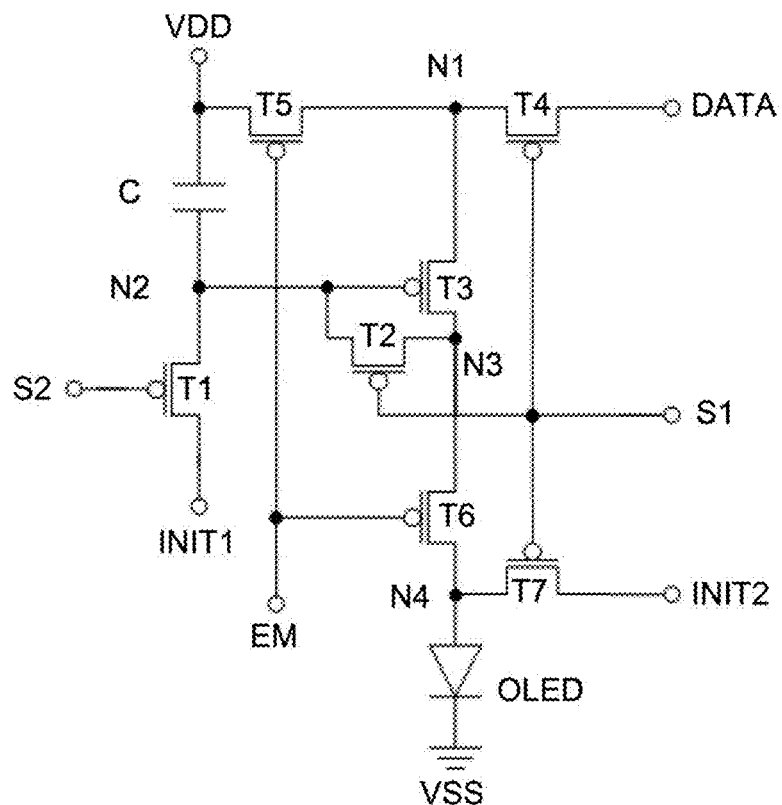
FIG. 3 is an equivalent circuit diagram of a pixel drive circuit.

In an exemplary embodiment, the pixel drive circuit may be in a 3T1C, 4T1C, 5T1C, 5T2C, 6T1C, or 7T1C structure. FIG. 3 illustrates an equivalent circuit diagram of a pixel drive circuit. Referring to FIG. 3, the pixel drive circuit may include seven switching transistors (first transistor T1 to seventh transistor T7), one storage capacitor C and eight signal lines (data signal line DATA, first scan signal line S1, second scan signal line S2, first initial signal line INIT1, second initial signal line INIT2, first power supply line VSS, second power supply line VDD and emitting signal line EM). The first initial signal line INIT1 and the second initial signal line INIT2 may be the same signal line.

In an exemplary embodiment, a control electrode of the first transistor T1 is connected to the second scan signal line S2, a first electrode of the first transistor T1 is connected to the first initial signal line INIT1, and a second electrode of the first transistor is connected to a second node N2. A control electrode of the second transistor T2 is connected to the first scan signal line S1, a first electrode of the second transistor T2 is connected to the second node N2, and a second electrode of the second transistor T2 is connected to a third node N3. A control electrode of the third transistor T3 is connected to the second node N2, a first electrode of the third transistor T3 is connected to a first node N1, and a second electrode of the third transistor T3 is connected to the third node N3. A control electrode of the fourth transistor T4 is connected to the first scan signal line S1, a first electrode of the fourth transistor T4 is connected to the data signal line DATA, and a second electrode of the fourth transistor T4 is connected to the first node N1. A control electrode of the fifth transistor T5 is connected to the emitting signal line EM, a first electrode of the fifth transistor T5 is connected to the second power supply line VDD, and a second electrode of the fifth transistor T5 is connected to the first node N1. A control electrode of the sixth transistor T6 is connected to the emitting signal line EM, a first electrode of the sixth transistor T6 is connected to the third node N3, and a second electrode of the sixth transistor T6 is connected to a first electrode of a light emitting device. A control electrode of the seventh transistor T7 is connected to the first scan signal line S1, a first electrode of the seventh transistor T7 is connected to the second initial signal line INIT2, and a second electrode of the seventh transistor T7 is connected to the first electrode of the light emitting device. A first terminal of the storage capacitor C is connected to the second power supply line VDD, and a second terminal of the storage capacitor C is connected to the second node N2.

In an exemplary embodiment, the first transistor T1 to the seventh transistor T7 may be P-type transistors or N-type transistors. Use of the same type of transistors in a pixel drive circuit may simplify a process flow, reduce process difficulties of a display panel, and improve a product yield. In some possible embodiments, the first transistor T1 to the seventh transistor T7 may include P-type transistors and N-type transistors.

In an exemplary embodiment, a second electrode of the light emitting device is connected to the first power supply line VSS. A signal of the first power supply line VSS is a low-level signal. A signal of the second power supply line VDD is a high-level signal continuously provided. The first scan signal line S1 is a scan signal line in the pixel drive circuit of a current display row, and the second scan signal line S2 is a scan signal line in the pixel drive circuit of a previous display row. That is, for an n-th display row, the first scan signal line S1 is S (n), and the second scan signal line S2 is S (n-1). The second scan signal line S2 of the current display row and the first scan signal line S1 in the pixel drive circuit of the previous display row are the same signal line, thus signal lines of the display panel may be reduced, so that the display panel has a narrow bezel.

Figure 4:
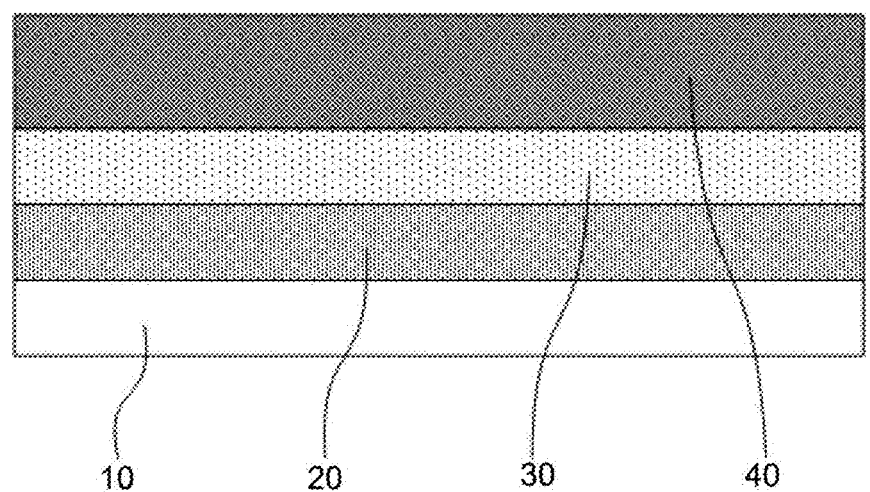
FIG. 4 is a schematic diagram of a sectional structure of a display substrate.

FIG. 4 is a schematic diagram of a sectional structure of a display substrate. As shown in FIG. 4, in a plane perpendicular to the display substrate, the display substrate may include a drive circuit layer 20 disposed on a substrate 10, an emitting device 30 disposed on the drive circuit layer 20, and an encapsulation structure layer 40 disposed on the emitting device 30. In some possible embodiments, the display substrate may include other film layers, such as a Post Spacer, which is not limited in the present disclosure.

In a display substrate, an encapsulation structure layer includes a first encapsulation layer, a second encapsulation layer, and a third encapsulation layer that are stacked. The first encapsulation layer and the third encapsulation layer are made of an inorganic material. The second encapsulation layer is made of an organic material. The second encapsulation layer is arranged between the first encapsulation layer and the third encapsulation layer. The study found that, in this stacked encapsulation structure, because the surface of the first encapsulation layer of the inorganic material adjacent to the substrate is overlapped with the cathode of the metal material, and the adhesion between the film layer of the inorganic material and the film layer of the metal material is quite different, the interface peeling phenomenon between the first encapsulation layer and the cathode is easy to occur in use, and the reliability of the film encapsulation is reduced. In addition, because there is a certain gap in adhesion between the inorganic material film and the organic material film, the interface peeling phenomenon between the interface of the first encapsulation layer and the interface of the second encapsulation layer, and between the interface of the second encapsulation layer and the interface of the third encapsulation layer will also occur in use, resulting in encapsulation failure.

The present disclosure provides a display substrate. In an exemplary embodiment, a display substrate may include a substrate, an emitting structure layer disposed on the substrate, and a encapsulation structure layer disposed on a side of the emitting structure layer away from the substrate; the encapsulation structure layer may include an encapsulation layer and at least one transition layer, a side of the transition layer adjacent to the substrate is in contact with a first side film layer, the side of the transition layer away from the substrate is in contact with a second side film layer, and the adhesion of the at least one transition layer is greater than the adhesion of one of the first side film layer and the second side film layer and less than the adhesion of the other of the first side film layer and the second side film layer.

In an exemplary embodiment, the encapsulation layer may include a first encapsulation layer, a second encapsulation layer and a third encapsulation layer arranged in sequence along a direction away from the substrate, the transition layer may include any one or more of the following: a first transition layer, a second transition layer and a third transition layer, the first transition layer is arranged between a cathode of the emitting structure layer and the first encapsulation layer, the second transition layer is arranged between the first encapsulation layer and the second encapsulation layer, and the third transition layer is arranged between the second encapsulation layer and the third encapsulation layer.

In an exemplary embodiment, the adhesion of the first transition layer is greater than the adhesion of the cathode of the emitting structure layer, and the adhesion of the first transition layer is smaller than the adhesion of the first encapsulation layer.

In an exemplary embodiment, the adhesion of the second transition layer is greater than the adhesion of the first encapsulation layer, and the adhesion of the second transition layer is less than the adhesion of the second encapsulation layer.

In an exemplary embodiment, the adhesion of the third transition layer is less than the adhesion of the second encapsulation layer, and the adhesion of the third transition layer is greater than the adhesion of the third side film layer.

In an exemplary embodiment, the first transition layer, the second transition layer, and the third transition layer may be an inorganic material layer having a water barrier capability, or may be an inorganic material layer not having a water barrier capability.

In an exemplary embodiment, the first transition layer, the second transition layer, and the third transition layer may each include a plurality of sub-transition layers.

In an exemplary embodiment, each of the first encapsulation layer and third encapsulation layer may include a plurality of sub-water barrier layers, and the second encapsulation layer may include a plurality of sub-organic layers.

Usually, adhesion is the mutual attraction between the contact parts of two different substances. Adhesion is generated when two objects are put together to reach a close contract of the interface molecules and form a new interface layer. Adhesion involves physical effects and chemical reactions of "interface". Each observed surface is related to several layers of physically or chemically adsorbed molecules. When a material is applied to a film layer and in the process of drying and curing, adhesion is generated. The level of adhesion depends on the properties of the material to a certain extent, so adhesion is a self-property of the material to a certain extent.

The present application provides a display substrate. By providing a transition layer in the encapsulation structure layer, the adhesion of one of the two film layers contacted by at least one transition layer is greater than that of the transition layer, and the adhesion of the other film layer is smaller than that of the transition layer. Both the adhesion difference and the stress mismatch between the film layers are reduced, the peeling of the interface between the film layers is effectively avoided, and the reliability of the film layer encapsulation is ensured. In this way, not only can the reliability of the thin film encapsulation be greatly improved, but also the bending resistance and curling ability of the display substrate may be greatly increased, which provides a guarantee for a display device with a long service life requirement.

Figure 5:
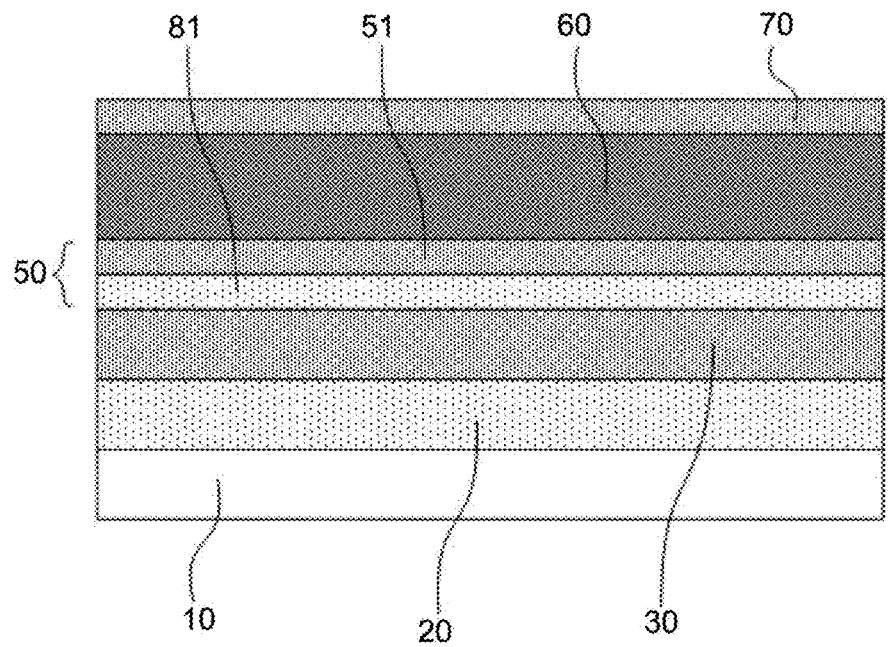
FIG. 5 is a schematic diagram of a structure of a display substrate according to an exemplary embodiment of the present disclosure.

FIG. 5 is a schematic diagram of a structure of a display substrate according to an exemplary embodiment of the present disclosure. As shown in FIG. 5, in an exemplary embodiment, the display substrate may include a substrate 10, a drive circuit layer 20 disposed on the substrate 10, a light emitting device 30 disposed on a side of the drive circuit layer 20 far away from the substrate 10, and an encapsulation structure layer disposed on a side of the light emitting device 30 away from the substrate 10. In an exemplary embodiment, the encapsulation structure layer may include a first composite encapsulation layer 50 disposed on a side of the light emitting device 30 away from the substrate 10, a second composite encapsulation layer 60 disposed on a side of the first composite encapsulation layer 50 away from the substrate 10, and a third composite encapsulation layer 70 disposed on a side of the second composite encapsulation layer 60 away from the substrate 10.

In an exemplary embodiment, the drive circuit layer 20 and the light emitting device 30 form an emitting structure layer.

In an exemplary embodiment, the first composite encapsulation layer 50 may include a first transition layer and a first encapsulation layer, and the first encapsulation layer may include a first water barrier layer.

In an exemplary embodiment, the first composite encapsulation layer 50 may include a first transition layer 81 disposed on a side of the light emitting device 30 away from the substrate 10 and a first water barrier layer 51 as a first encapsulation layer disposed on a side of the first transition layer 81 away from the substrate 10, and the second composite encapsulation layer 60 is disposed on a surface of the first water barrier layer 51 on a side away from the substrate 10.

Figure 8:
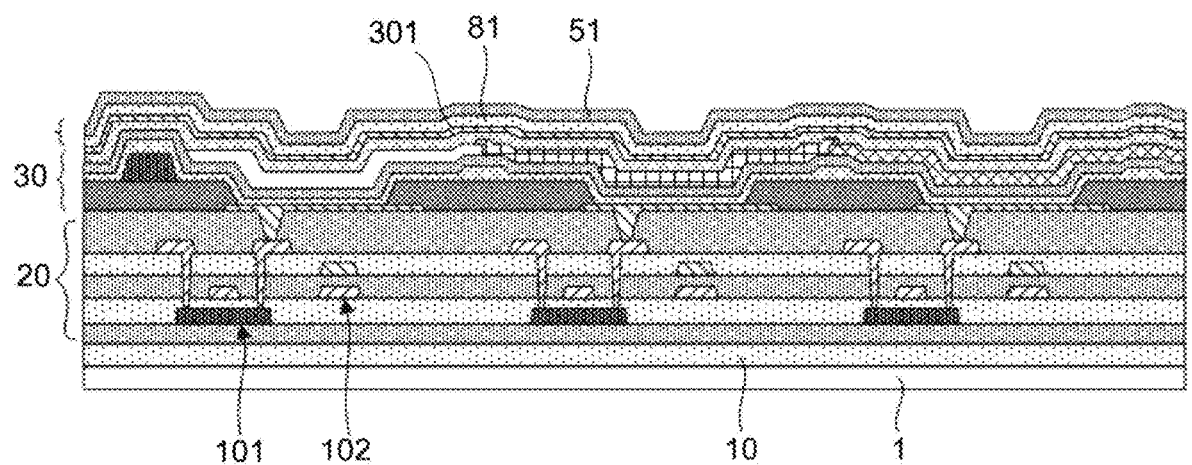
FIG. 8 is a schematic diagram of a structure after a pattern of a first composite encapsulation layer is formed according to the present disclosure.

In an exemplary embodiment, the adhesion of the first transition layer 81 is greater than that of the cathode 301 in the light emitting device 30 as shown in FIG. 8 but less than that of the first water barrier layer 51.

In an exemplary embodiment, the material of the first transition layer 81 may include, but is not limited to, silicon oxide (SiOx), silicon carbonitride (SiCN), or silicon nitride (SiNx), and the thickness may be about 100 Å to 5000 Å. The first transition layer 81 is configured to reduce the adhesion difference and the stress mismatch between the film layers, so as to avoid interface peeling between the film layers, or configured to not only reduce the adhesion difference and the stress mismatch between the film layers, but also isolate water and oxygen, thereby improving the water and oxygen barrier function.

In an exemplary embodiment, the material of the first water barrier layer 51 may include, but is not limited to, silicon nitride (SiNx), silicon oxynitride (SiONx), alumina (AlO), or the like, and the thickness may be about 500 Å to 12000 Å. The first water barrier layer 51 is configured to isolate water and oxygen so as to improve the water and oxygen barrier function and ensure that external water vapor cannot enter the light emitting device.

In an exemplary embodiment, the second composite encapsulation layer 60 may include a second encapsulation layer, the material of the second encapsulation layer may include, but is not limited to, acrylate or epoxy, and the thickness of the second composite encapsulation layer 60 may be about 1.0 μm to 3.0 μm.

In an exemplary embodiment, the third composite encapsulation layer 70 may include a third encapsulation layer whose material may include, but is not limited to, silicon carbonitride, silicon nitride, silicon oxynitride, or alumina, and may have a thickness of about 500 Å to 12000 Å.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on a substrate through a process such as depositing, coating, or the like. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a single patterning process, and a "thickness" of a film layer is a dimension of the film layer in a direction perpendicular to a display substrate. In an exemplary embodiment of the present disclosure, "an orthographic projection of B is within the range of an orthographic projection of A" or "an orthographic projection of A contains an orthographic projection of B" refers to a boundary of the orthographic projection of B falling within a boundary range of the orthographic projection of A, or the boundary of the orthographic projection of A is overlapped with the boundary of the orthographic projection of B.

In an exemplary embodiment, taking each sub-pixel including a drive transistor and a storage capacitor as an example, the preparation process of the display substrate may include the following operations.

(1) A substrate 10 is prepared on a glass carrier plate 1. In an exemplary embodiment of the present disclosure, the substrate 10 may include a first flexible material layer, a first inorganic material layer, a semiconductor layer, a second flexible material layer and a second inorganic material layer which are stacked on the glass carrier plate 1. Materials of the first flexible material layer and second flexible material layer may be polyimide (PI), polyethylene terephthalate (PET), or a polymer soft film subjected to surface treatment, etc. Materials of the first inorganic material layer and second inorganic material layer may be silicon nitride (SiNx), silicon oxide (SiOx), or the like, so as to improve water-oxygen resistance capability of the substrate. The first inorganic material layer and second inorganic material layer are also referred to as barrier layers. A material of the semiconductor layer may be amorphous silicon (a-si). In an exemplary embodiment, taking a laminated structure PI1/Barrier1/a-si/PI2/Barrier 2 as an example, the manufacturing process may include: coating a layer of polyimide on the glass carrier plate 1 first, and forming a first flexible layer (PI1) after curing the layer of polyimide to form a film; subsequently, depositing a layer of barrier thin film on the first flexible layer to form a first barrier layer (Barrier 1) covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible layer (PI2) after curing the layer of polyimide to form a film; then depositing a layer of barrier thin film on the second flexible layer to form a second barrier layer (Barrier 2) covering the second flexible layer, so as to complete the manufacturing of the substrate 10.

(2) A pattern of a driving circuit layer is prepared on the substrate 10. In an exemplary embodiment, preparing the pattern of the drive circuit layer on the substrate 10 may include:

A first insulating thin film and a semiconductor thin film are sequentially deposited on the substrate 10. The semiconductor thin film is patterned through a patterning process to form a first insulating layer covering the entire substrate 10 and a pattern of a semiconductor layer provided on the first insulating layer. The pattern of the semiconductor layer at least includes an active layer in each sub-pixel.

Then, a second insulating thin film and a first metal thin film are sequentially deposited. The first metal thin film is patterned through a patterning process to form a second insulating layer covering the pattern of the semiconductor layer and a pattern of a first metal layer disposed on the second insulating layer. The pattern of the first metal layer at least includes a gate electrode and first capacitor electrode in each sub-pixel.

Then, a third insulating film and a second metal film are deposited sequentially, and the second metal film is patterned through the patterning processes to form a third insulating layer overlying the first metal layer and form a pattern of a second metal layer disposed on the third insulating layer. The pattern of the second metal layer pattern at least include second capacitance electrode located in each sub-pixel, and there is an overlapping region between the orthographic projection of the second capacitance electrode and the orthographic projection of the first capacitance electrode on the substrate.

Subsequently, a fourth insulating film is deposited, and patterns of a plurality of vias are formed through a patterning process, and the fourth insulating layer, the third insulating layer and the second insulating layer in the first via are etched away to expose both ends of the active layer.

Then, a third metal thin film is deposited. The third metal thin film is patterned through a patterning process to form a pattern of a third metal layer on the fourth insulating layer. The pattern of the third metal layer at least includes a source electrode and drain electrode in each sub-pixel. The source electrode and the drain electrode are connected to the active layer through the first via respectively.

Then, a planarization thin film is coated; the planarization thin film is patterned through a patterning process to form a planarization layer. A second via is formed on the planarization layer, and the planarization layer in the second via is removed, exposing the drain electrode in each sub-pixel.

Figure 6:
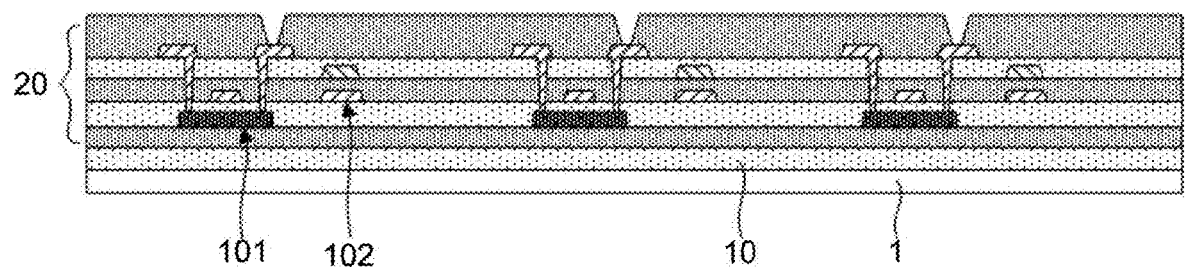
FIG. 6 is a schematic diagram of a structure after a pattern of a drive circuit layer is formed according to the present disclosure.

So far, the pattern of the drive circuit layer 20 is formed on the substrate 10, as illustrated in FIG. 6. In an exemplary embodiment, the active layer, the gate electrode, the source electrode, and the drain electrode form a first transistor 101, and the first capacitance electrode and the second capacitance electrode form a storage capacitor 102. In an exemplary embodiment, the first transistor 101 may be a drive transistor in a pixel drive circuit, and the drive transistor may be a thin film transistor (TFT).

In an exemplary embodiment, the first insulating layer, the second insulating layer, the third insulating layer, and the fourth insulating layer may be made of any one or more of silicon oxide (SiOx), silicon nitride (SiNx), and silicon nitride (SiON), and each may be in a single layer structure, a multi-layer structure, or a composite layer structure. The first insulating layer is called a buffer layer, which is used to improve the water and oxygen resistance of the substrate. The second insulating layer and the third insulating layer are called gate insulating (GI) layers. The fourth insulating layer is called an interlayer insulating (ILD) layer. The first metal film, the second metal film and the third metal film may be made of a metallic material, such as any one or more of silver (Ag), copper (Cu), aluminum (Al), titanium (Ti) and molybdenum (Mo), or an alloy material of the above metals, such as aluminum-neodymium alloy (AlNd) or molybdenum-niobium alloy (MoNb), which may be a single-layer structure or multi-layer composite structure, such as Ti/Al/Ti. The active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene and other materials, that is, the present disclosure is applicable to transistors prepared based on an oxide technology, a silicon technology, and an organic matter technology.

In an exemplary embodiment, the drive circuit layer 20 may further include a film layer such as a fifth insulating layer, a fourth metal layer, a second planarization layer, etc. Each sub-pixel may further include a structure such as a power supply line, a connection electrode, etc. The present disclosure is not limited herein.

(3) A light emitting device is prepared on the substrate on which the above patterns are formed. In an exemplary embodiment, preparing a light emitting device on a substrate on which the foregoing patterns are formed may include:

A transparent conductive thin film is deposited on the substrate with the above-mentioned patterns formed. The transparent conductive thin film is patterned through a patterning process to form a pattern of an anode. The anode is connected to the drain electrode of the first transistor 101 through a second via.

Subsequently, a pixel define thin film is coated, and the pixel define thin film is patterned through a patterning process to form a pattern of a pixel define layer. The pixel define layer is formed with a pixel opening in each sub-pixel, and the pixel define layer in the pixel opening is removed to expose the surface of the anode.

Subsequently, an inorganic thin film is coated, and the inorganic thin film is patterned through a patterning process to form a post spacer pattern, and the post spacer is provided on the pixel define layer.

Subsequently, an organic emitting layer and a cathode are sequentially formed, the organic emitting layer is connected to the anode in the pixel opening, and the cathode is connected to the organic emitting layer, so that the organic emitting layer emits light of corresponding colors under the drive of the anode and the cathode.

Figure 7:
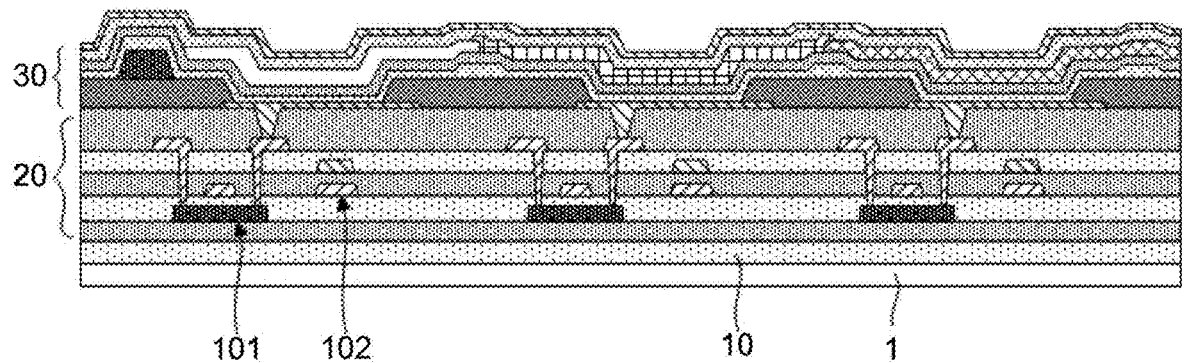
FIG. 7 is a schematic diagram of a structure after a light emitting device is formed according to the present disclosure.

So far, the pattern of the light emitting device 30 has been formed on the driving circuit layer 20, as shown in FIG. 7. In an exemplary embodiment, a structure such as an isolating dam may be formed during the preparation of the light emitting device, and the present disclosure is not limited herein.

In an exemplary implementation, the organic emitting layer of the light emitting device 30 may include a emitting layer (EML), and include one or more of a hole injection layer (HIL), a hole transport layer (HTL), a hole block layer (HBL), an electron block layer (EBL), an electron injection layer (EIL) and an electron transport layer (ETL). Under driving of voltages of the anode and the cathode, light is emitted according to the required gray scale using light emitting properties of the organic emitting layer.

In an exemplary embodiment, the emitting layers of the light emitting device 30 of different colors are different. For example, a red light emitting element includes a red emitting layer, a green light emitting element includes a green emitting layer, and a blue light emitting element includes a blue emitting layer. In order to reduce a process difficulty and improve a yield, a hole injection layer and a hole transport layer located on a side of an emitting layer may be a common layer, and an electron injection layer and an electron transport layer located on the other side of the emitting layer may be a common layer. In an exemplary embodiment, any one or more of the hole injection layer, the hole transport layer, the electron injection layer, and the electron transport layer may be prepared by one process (one evaporation process or one ink-jet printing process), while isolation is achieved by surface segment difference or surface treatment of the formed film layers, etc. For example, any one or more of a hole injection layer, a hole transport layer, an electron injection layer, and an electron transport layer corresponding to adjacent sub-pixels may be isolated. In an exemplary implementation, the organic emitting layer may be formed by evaporation using a fine metal mask (FMM) or an open mask, or formed using an inkjet process.

In an exemplary embodiment, the transparent conductive thin film may include indium tin oxide (ITO) or indium zinc oxide (IZO). The pixel define layer may be made of polyimide, acrylic, polyethylene terephthalate, or the like. The cathode may be made of any one or more of magnesium (Mg), silver (Ag), aluminum (Al), copper (Cu) and lithium (Li), or an alloy made of any one or more of the above metals.

(4) A first composite encapsulation layer is formed on the substrate on which the aforementioned patterns are formed. In an exemplary embodiment, forming the first composite encapsulation layer on the substrate on which the aforementioned patterns are formed may include first depositing a transition thin film on the substrate on which the aforementioned patterns are formed to form a first transition layer 81 covering the cathode 301 of the light emitting device 30 as shown in FIG. 8. Subsequently, a water barrier film is deposited on the first transition layer 81 to form a first water barrier layer 51 covering the first transition layer 81, as shown in FIG. 8.

In an exemplary embodiment, the covering areas of the first transition layer 81 and the first water barrier layer 51 may be the same or may be different, and the orthographic projection of the first transition layer 81 on the substrate is within the range of the orthographic projection of the first water barrier layer 51 on the substrate.

In an exemplary embodiment, the material of the first transition layer 81 may include silicon carbonitride, which has an adhesion of about 0.6N to 0.7N, and the material of the first water barrier layer 51 may include silicon nitride, which has an adhesion of about 1.3N to 1.9N. The adhesion of the first transition layer 81 is greater than that of the cathode of the light emitting device 30, and the adhesion of the first transition layer 81 is less than that of the first water barrier layer 51.

In an exemplary embodiment, the thickness of the first transition layer 81 may be about 100 Å to 5000 Å, and the thickness of the first water barrier layer 51 may be about 6000 Å to 12000 Å.

In some possible implementations, the thickness of the first transition layer 81 may be about 200 Å to 600 Å, and the thickness of the first water barrier layer 51 may be about 4000 Å to 6000 Å. For example, the thickness of silicon carbonitride may be about 300 Å, and the thickness of silicon nitride may be about 4700 Å. For another example, the thickness of silicon carbonitride may be about 500 Å, and the thickness of silicon nitride may be about 4500 Å.

In an exemplary embodiment, the density of silicon carbonitride is about 1.6 $g/cm^3$ to 1.9 $g/cm^3$, the density of silicon nitride is about 2.2 $g/cm^3$ to 2.5 $g/cm^3$, and the density of the first transition layer 81 is less than the density of the first water barrier layer 51.

In an exemplary embodiment, the modulus of silicon carbonitride is about 10 Gpa to 40 Gpa, the modulus of silicon nitride is about 60 Gpa to 100 Gpa, and the modulus of the first transition layer 81 is less than the modulus of the first water barrier layer 51.

In an exemplary embodiment, the silicon carbonitride has a hardness of about 1 Gpa to 4 Gpa, the silicon nitride has a hardness of about 6 Gpa to 11 Gpa, and the first transition layer 81 has hardness less than that of the first water barrier layer 51.

In a display substrate, a first encapsulation layer using silicon nitride is directly formed on a cathode of a light emitting device, and a difference in adhesion between the first encapsulation layer and the cathode is about 1.3N. Due to the large adhesion difference between the two film layers, there is a serious stress mismatch between the first encapsulation layer and the cathode, which easily leads to the peeling of the interface between the first encapsulation layer and the cathode, resulting in encapsulation failure.

In the present disclosure, a first composite encapsulation layer including a first transition layer and a first water barrier layer is disposed, and the first transition layer is provided between the cathode and the first water barrier layer. The first transition layer adopts silicon carbonitride with an adhesion of about 0.6N to 0.7N, so that the adhesion difference between the cathode and the first transition layer is about 0.6N, and the adhesion difference between the first transition layer and the first water barrier layer is about 0.7N to 1.2N. Both the adhesion difference and the stress mismatch between the film layers are reduced, the peeling of the interface between the film layers is effectively avoided, and the reliability of the film encapsulation is ensured.

It is found through the study that the adhesion of cathode prepared by evaporation process is small. Reducing the thin film stress of the film layer in contact with cathode can effectively reduce the stress mismatch between film layers. Generally, the film stress is divided into tensile stress and compressive stress. In mathematical expression, the tensile stress is positive and the compressive stress is negative. In low temperature (<100° C.) ion-enhanced chemical vapor deposition (PECVD) process, the stress of silicon nitride thin film is about −100 Mpa to 90 Mpa, which tends to be compressive stress. Because the molecular composition, adhesion, density, modulus and hardness of silicon carbonitride are smaller than those of silicon nitride, the stress of silicon carbonitride thin film in low temperature PECVD deposition process is about −20 Mpa to 100 Mpa, and the compressive stress is small, even tends to be tensile stress. In this way, in a case that silicon carbonitride material is used as the first transition layer, when the first transition layer is formed on the cathode, the thin film stress applied by the first transition layer on the cathode is small, alternatively, there is no thin film stress is applied to the cathode, even a tensile stress which can counteract the compressive stress applied by other film layers is applied to the cathode. Therefore, it not only effectively reduces the film stress mismatch between the cathode and the encapsulation layer, effectively avoids the peeling of the interface between the film layers, but also improves the bending resistance and crimping ability of the display substrate, and improves the working reliability and service life of the display substrate.

In an exemplary embodiment, the first transition layer and the first water barrier layer may alternatively be made of other inorganic materials, as long as the adhesion of the first transition layer is between the cathode and the first water barrier layer, the effect of avoiding interface peeling between the film layers can also be achieved. For example, the material of the first transition layer may include silicon carbonitride and the material of the first water barrier layer may include silicon oxynitride. As another example, the material of the first transition layer may include silicon nitride, and the material of the first water barrier layer may include silicon oxynitride.

Figure 9:
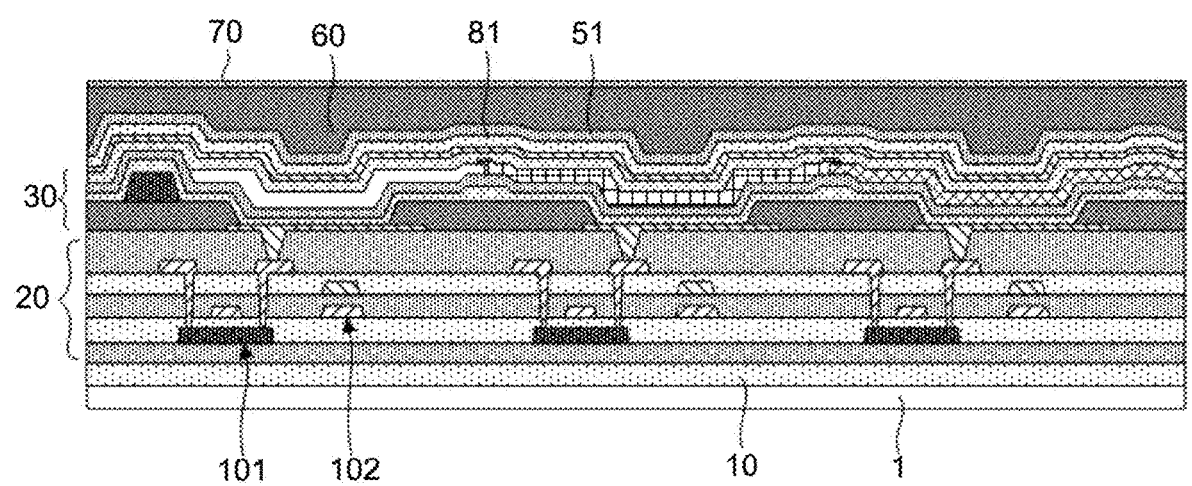
FIG. 9 is a schematic diagram of a structure after patterns of a second composite encapsulation layer and a third composite encapsulation layer are formed according to the present disclosure.

(5) A second composite encapsulation layer and a third composite encapsulation layer are formed on a substrate on which the aforementioned patterns are formed. In an exemplary embodiment, forming the second composite encapsulation layer and the third composite encapsulation layer on the substrate on which the foregoing patterns are formed may include: the second composite encapsulation layer 60 is formed on the first composite encapsulation layer by coating or inkjet printing, and then an encapsulation film is deposited to form the third composite encapsulation layer 70 covering the second composite encapsulation layer 60, as shown in FIG. 9.

In an exemplary embodiment, the second composite encapsulation layer 60 may include a second encapsulation layer, which may be made of a material such as acrylate or epoxy and may have a thickness of about 1.0 μm to 3.0 μm. The third composite encapsulation layer 70 includes a third encapsulation layer, which may be made of silicon oxynitride, silicon nitride, silicon oxynitride, alumina, etc., and the thickness may be about 6000 Å to 12000 Å.

In an exemplary implementation, the display substrate may include a display region and a bezel region located at the periphery of the display region. The second encapsulation layer is formed in the display region, which is not limited in the present disclosure.

As can be seen from the structure and preparation process of the display substrate described above, according to the display substrate provided in the present disclosure, by providing a first composite encapsulation layer including a first transition layer and a first water barrier layer, wherein the first transition layer is arranged between the cathode and the first water barrier layer, the adhesion of the first transition layer is greater than that of the cathode, but less than that of the first water barrier layer, the adhesion difference between adjacent film layers is reduced, and the stress mismatch between film layers is reduced, effectively avoiding the peeling of the interface between the film layers, ensuring the reliability of the thin film encapsulation and improving the yield. In addition, by configuring the materials of the first transition layer and the first water barrier layer, the bending resistance and crimping ability of the display substrate are improved, the working reliability and service life of the display substrate are improved, and the guarantee is provided for the display apparatus with long service life requirement. The preparation process of the display substrate in the exemplary embodiment of the present disclosure has good process compatibility, simple process achievement, easy implementation, high production efficiency, and a low production cost.

Figure 10:
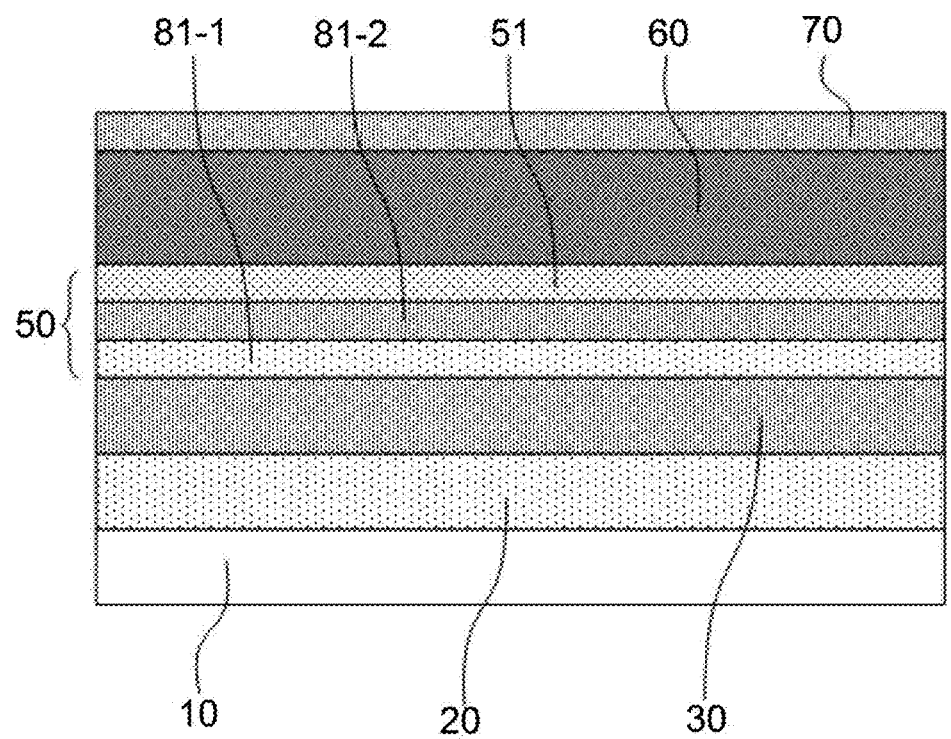
FIG. 10 is a schematic diagram of a structure of another display substrate according to an exemplary embodiment of the present disclosure.

FIG. 10 is a schematic diagram of a structure of another display substrate according to an exemplary embodiment of the present disclosure. As shown in FIG. 10, in an exemplary embodiment, the display substrate may include a substrate 10, a drive circuit layer 20 disposed on the substrate 10, a light emitting device 30 disposed on a side of the drive circuit layer 20 away from the substrate 10, and an encapsulation structure layer disposed on the side of the light emitting device 30 away from the substrate 10. In an exemplary embodiment, the encapsulation structure layer may include a first composite encapsulation layer 50 disposed on a side of the light emitting device 30 away from the substrate 10, a second composite encapsulation layer 60 disposed on a side of the first composite encapsulation layer 50 away from the substrate 10, and a third composite encapsulation layer 70 disposed on a side of the second composite encapsulation layer 60 away from the substrate 10.

In an exemplary embodiment, the first composite encapsulation layer 50 may include a first transition layer and a first encapsulation layer, the first transition layer may include a first sub-transition layer and a second sub-transition layer, and the first encapsulation layer may include a first water barrier layer.

In an exemplary embodiment, the first composite encapsulation layer 50 may include a first sub-transition layer 81-1 disposed on the side of the light emitting device 30 away from the substrate 10, a second sub-transition layer 81-2 disposed on the side of the first sub-transition layer 81-1 away from the substrate, and a first water barrier layer 51 disposed on the side of the second sub-transition layer 81-2 away from the substrate. The second composite encapsulation layer 60 is provided on a surface of the first water barrier layer 51 on a side away from the substrate 10.

In an exemplary embodiment, the adhesion of the first sub-transition layer 81-1 is greater than that of the cathode in the light emitting device 30 but less than that of the second sub-transition layer 81-2. The adhesion of the second sub-transition layer 81-2 is greater than that of the first sub-transition layer 81-1 but less than that of the first water barrier layer 51.

In an exemplary embodiment, the material of the first sub-transition layer 81-1 may include silicon carbonitride, which has an adhesion of about 0.6 N to 0.7N, the material of the second sub-transition layer 81-2 may include silicon nitride, which has an adhesion of about 1.3 N to 1.9N, and the material of the first water barrier layer 51 may include silicon oxynitride, which has an adhesion of about 2.5 N to 2.8 N. The adhesion of the first sub-transition layer 81-1 is greater than that of the cathode in the light emitting device 30, but smaller than that of the second sub-transition layer 81-2, the adhesion of the second sub-transition layer 81-2 is smaller than that of the first water barrier layer 51.

In an exemplary embodiment, the thickness of the first sub-transition layer 81-1 may be about 100 Å to 5000 Å, the thickness of the second sub-transition layer 81-2 may be about 100 Å to 5000 Å, and the thickness of the first water barrier layer 51 may be about 6000 Å to 12000 Å. The first sub-transition layer 81-1 and the second sub-transition layer 81-2 are configured to reduce the adhesion difference between the film layers and to reduce the stress mismatch between the film layers so as to avoid interface peeling between the film layers. The first water barrier layer 51 is configured to isolate water and oxygen so as to improve the water and oxygen barrier function and ensure that external water vapor cannot enter the light emitting device.

In some possible implementations, the thickness of the first sub-transition layer 81-1 may be about 200 Å to 600 Å, the thickness of the second sub-transition layer 81-2 may be about 200 Å to 600 Å, and the thickness of the first water barrier layer 51 may be about 4000 Å to 6000 Å. For example, the thickness of silicon carbonitride may be about 300 Å, the thickness of silicon nitride may be about 500 Å, and the thickness of silicon oxynitride may be about 4700 Å. For another example, the thickness of silicon carbonitride may be about 500 Å, the thickness of silicon nitride may be about 500 Å, and the thickness of silicon oxynitride may be about 4500 Å.

In an exemplary embodiment, the density of silicon carbonitride is about 1.6 $g/cm^3$ to 1.9 $g/cm^3$, the density of silicon nitride is about 2.2 $g/cm^3$ to 2.5 $g/cm^3$, and the density of silicon oxynitride is about 2.0 $g/cm^3$ to 2.3 $g/cm^3$, and the density of the first sub-transition layer 81-1 is less than the density of the second sub-transition layer 81-2.

In an exemplary embodiment, the modulus of silicon carbonitride is about 10 Gpa to 40 Gpa, the modulus of silicon nitride is about 60 Gpa to 100 Gpa, the modulus of silicon oxynitride is about 30 Gpa to 70 Gpa, and the modulus of the first sub-transition layer 81-1 is less than the modulus of the second sub-transition layer 81-2.

In an exemplary embodiment, silicon carbonitride has a hardness of about 1 Gpa to 4 Gpa, silicon nitride has a hardness of about 6 Gpa to 11 Gpa, silicon oxynitride has a hardness of about 4 Gpa to 7 Gpa, and the hardness of the first sub-transition layer 81-1 is less than that of the second sub-transition layer 81-2.

In an exemplary embodiment, the materials and structures of the second composite encapsulation layer 60 and the third composite encapsulation layer 70 may be similar to those of the foregoing embodiments.

In the exemplary embodiment, the preparation process of the display substrate in this embodiment is similar to the preparation process of the foregoing embodiment, except that the first sub-transition film, the second sub-transition film and the water barrier film are sequentially deposited in the process of forming the first composite encapsulation layer.

In a display substrate, a first encapsulation layer using silicon oxynitride is directly formed on a cathode of a light emitting device, and the difference in adhesion between the first encapsulation layer and the cathode is about 2.5N or more, which easily leads to peeling of the interface between the first encapsulation layer and the cathode.

According to the present invention, a first encapsulation layer including a first sub-transition layer, a second sub-transition layer and a first water barrier layer is provided. The first sub-transition layer is arranged between the cathode and the second sub-transition layer, and the second sub-transition layer is arranged between the first sub-transition layer and the first water barrier layer. The first sub-transition layer adopts silicon carbonitride with an adhesion of about 0.6N to 0.7N, the second sub-transition layer adopts silicon nitride with an adhesion of about 1.3N to 1.9N, and the first water barrier layer adopts silicon oxynitride with an adhesion of about 2.5N to 2.8N. Therefore, the adhesion difference between the cathode and the first sub-transition layer is about 0.6N, the adhesion difference between the first sub-transition layer and the second sub-transition layer is about 0.7N to 1.2N, and the adhesion difference between the second sub-transition layer and the first water barrier layer is about 0.9N to 1.2 N. Both the adhesion difference and the stress mismatch between the film layers are reduced, the peeling of the interface between the film layers is effectively avoided, and the reliability of the film encapsulation is ensured.

Similarly, in a case that silicon carbonitride material is used as the first sub-transition layer, when the first sub-transition layer is formed on the cathode, the film stress applied by the first sub-transition layer on the cathode is small, alternatively, there is no film stress is applied to the cathode, even a tensile stress which can counteract the compressive stress of other films is applied to the cathode. Therefore, it not only effectively reduces the film stress mismatch between the cathode and the encapsulation layer, effectively avoids the peeling of the interface between the film layers, but also improves the bending resistance and crimping ability of the display substrate, and improves the working reliability and service life of the display substrate.

In an exemplary embodiment, the first sub-transition layer, the second sub-transition layer and the first water barrier layer may alternatively be made of other inorganic materials, as long as the adhesion of the first sub-transition layer is between the cathode and the second sub-transition layer, and the adhesion of the second sub-transition layer is between the first sub-transition layer and the first water barrier layer, the effect of avoiding interface peeling between the film layers can also be achieved. For example, the material of the first sub-transition layer may include silicon oxide, the material of the second sub-transition layer may include silicon carbonitride, and the material of the first water barrier layer may include silicon nitride. As another example, the material of the first sub-transition layer may include silicon oxide, the material of the second sub-transition layer may include silicon nitride, and the material of the first water barrier layer may include silicon oxynitride.

Figure 11:
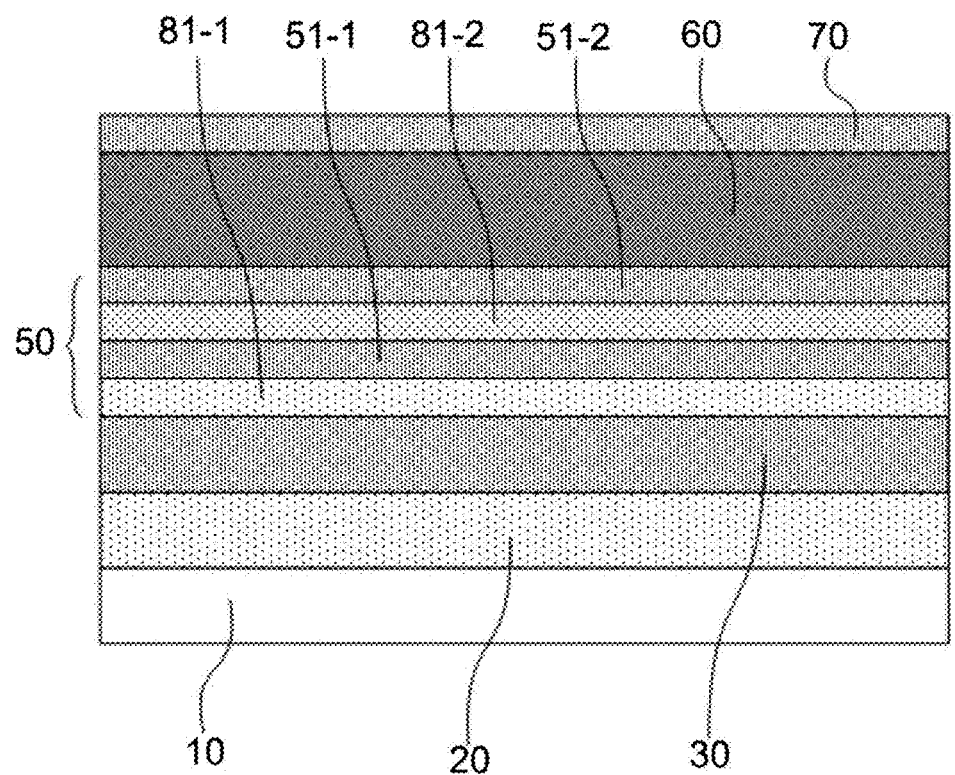
FIG. 11 is a schematic diagram of a structure of yet another display substrate according to an exemplary embodiment of the present disclosure.

FIG. 11 is a schematic diagram of a structure of yet another display substrate according to an exemplary embodiment of the present disclosure. As shown in FIG. 11, in an exemplary embodiment, the display substrate may include a substrate 10, a drive circuit layer 20 disposed on the substrate 10, a light emitting device 30 disposed on a side of the drive circuit layer 20 far away from the substrate 10, and an encapsulation structure layer disposed on the side of the light emitting device 30 away from the substrate 10. In an exemplary embodiment, the encapsulation structure layer may include a first composite encapsulation layer 50 disposed on a side of the light emitting device 30 away from the substrate 10, a second composite encapsulation layer 60 disposed on a side of the first composite encapsulation layer 50 away from the substrate 10, and a third composite encapsulation layer 70 disposed on a side of the second composite encapsulation layer 60 away from the substrate 10.

In an exemplary embodiment, the first composite encapsulation layer 50 may include a first transition layer and a first encapsulation layer, the first transition layer may include a first sub-transition layer and a second sub-transition layer, and the first encapsulation layer may include a first sub-water barrier layer and a second sub-water barrier layer.

In an exemplary embodiment, the first composite encapsulation layer 50 may include a first sub-transition layer 81-1 disposed on a side of the light emitting device 30 away from the substrate 10, a first sub-water barrier layer 51-1 disposed on a side of the first sub-transition layer 81-1 away from the substrate, a second sub-transition layer 81-2 disposed on a side of the first sub-water barrier layer 51-1 away from the substrate, and a second sub-water barrier layer 51-2 disposed on a side of the second sub-transition layer 81-2 away from the substrate, and a second composite encapsulation layer 60 is disposed on a surface of the second sub-water barrier layer 51-2 away from the substrate 10.

In an exemplary embodiment, the adhesion of the first sub-transition layer 81-1 is greater than that of the cathode 301 in the light emitting device 30 as shown in FIG. 8 but less than that of the first sub-water barrier layer 51-1. The adhesion of the first sub-water barrier layer 51-1 is greater than that of the first sub-transition layer 81-1, but less than that of the second sub-transition layer 81-2. The adhesion of the second sub-transition layer 81-2 is larger than that of the first sub-water barrier layer 51-1 but smaller than that of the second sub-water barrier layer 51-2.

In an exemplary embodiment, the material of the first sub-transition layer 81-1 may include silicon oxide, which has an adhesion of about 0.2 N to 0.4 N, the material of the first sub-water barrier layer 51-1 may include silicon carbonitride, which has an adhesion of about 0.6 N to 0.7 N, the material of the second sub-transition layer 81-2 may include silicon nitride, which has an adhesion of about 1.3 N to 1.9 N, and the material of the second sub-water barrier layer 51-2 may include silicon oxynitride, which has an adhesion of about 2.5 N to 2.8 N. The adhesion of the first sub-transition layer 81-1 is larger than that of the cathode 301 in the light emitting device 30 as shown in FIG. 8, but smaller than that of the first sub-water barrier layer 51-1, the adhesion of the first sub-water barrier layer 51-1 is smaller than that of the second sub-transition layer 81-2 and the adhesion of the second sub-transition layer 81-2 is smaller than that of the second sub-water barrier layer 51-2.

In an exemplary embodiment, the thickness of the first sub-transition layer 81-1 may be about 100 Å to 5000 Å, the thickness of the second sub-transition layer 81-2 may be about 100 Å to 5000 Å, the thickness of the first sub-water barrier layer 51-1 may be about 6000 Å to 12000 Å, and the thickness of the second sub-water barrier layer 51-1 may be about 6000 Å to 12000 Å. The first sub-transition layer 81-1 and the second sub-transition layer 81-2 are configured to reduce the adhesion difference between the film layers and to reduce the stress mismatch between the film layers so as to avoid interface peeling between the film layers. The first sub-water barrier layer 51-1 and the second sub-water barrier layer 51-2 are configured to isolate water and oxygen so as to improve the water and oxygen barrier function and ensure that external water vapor cannot enter the light emitting device.

In some possible implementations, the thickness of the first sub-transition layer 81-1 may be about 200 Å to 600 Å, the thickness of the second sub-transition layer 81-2 may be about 200 Å to 600 Å, the thickness of the first sub-water barrier layer 51-1 may be about 2000 Å to 5000 Å, and the thickness of the second sub-water barrier layer 51-2 may be about 2000 Å to 5000 Å. For example, the thickness of silicon oxide may be about 300 Å, the thickness of silicon nitride may be about 500 Å, the thickness of silicon carbonitride may be about 2000 Å, and the thickness of silicon oxynitride may be about 2700 Å. For another example, the thickness of silicon oxide may be about 500 Å, the thickness of silicon nitride may be about 500 Å, the thickness of silicon carbonitride may be about 2200 Å, and the thickness of silicon oxynitride may be about 2300 Å.

In an exemplary embodiment, the materials and structures of the second composite encapsulation layer 60 and the third composite encapsulation layer 70 may be similar to those of the foregoing embodiments.

In the exemplary embodiment, the preparation process of the display substrate in this embodiment is similar to the preparation process of the foregoing embodiment, except that the first sub-transition film, the first sub-water barrier film, the second sub-transition film and the second sub-water barrier film are sequentially deposited in the process of forming the first composite encapsulation layer.

The present disclosure arranges a first encapsulation layer including a first sub-transition layer, a first sub-water barrier layer, a second sub-transition layer and a second sub-water barrier layer, wherein, the first sub-transition layer is arranged between the cathode and the second sub-transition layer, the second sub-transition layer is arranged between the first sub-water barrier layer and the second sub-water barrier layer. The first sub-transition layer adopts silicon oxide with an adhesion of about 0.2N to 0.4N, the first sub-water barrier layer adopts silicon carbonitride with an adhesion of about 0.6N to 0.7N, the second sub-transition layer adopts silicon nitride with an adhesion of about 1.3N to 1.9N, and the second sub-water barrier layer adopts silicon oxynitride with an adhesion of about 2.5N to 2.8N. Therefore, the adhesion difference between the cathode and the first sub-transition layer is about 0.2N, the adhesion difference between the first sub-transition layer and the first sub-water barrier layer is about 0.3N to 0.4N, the adhesion difference between the first sub-water barrier layer and the second sub-transition layer is about 0.7N to 1.2N, and the adhesion difference between the second sub-transition layer and the second sub-water barrier layer is about 0.9N to 1.2N. Both the adhesion difference and the stress mismatch between the film layers are reduced, the peeling of the interface between the film layers is effectively avoided, and the reliability of the film encapsulation is ensured. The bending resistance and crimping ability of display substrates are improved, and the working reliability and service life of display substrates are increased.

In an exemplary embodiment, in the structure shown in FIG. 11, the materials of the first sub-transition layer 81-1 and the second sub-transition layer 81-2 may each include silicon nitride, and the materials of the first sub-water barrier layer 51-1 and the second sub-water barrier layer 51-2 may each include silicon oxynitride.

In an exemplary embodiment, the thickness of the first sub-transition layer 81-1 and the second sub-transition layer 81-2 may be about 100 Å to 5000 Å, and the thickness of the first sub-water barrier layer 51-1 and the second sub-water barrier layer 51-2 may be about 300 Å to 5000 Å. The first sub-transition layer 81-1 and the second sub-transition layer 81-2 are configured to not only reduce the adhesion difference between the film layers and reduce the stress mismatch between the film layers, and but also isolate water and oxygen so as to improve the water and oxygen barrier function. The first sub-water barrier layer 51-1 and the second sub-water barrier layer 51-2 are configured to isolate water and oxygen so as to improve the water and oxygen barrier function and ensure that external water vapor cannot enter the light emitting device.

In some possible implementations, the thickness of the first sub-transition layer 81-1 may be about 2000 Å to 5000 Å, the thickness of the second sub-transition layer 81-2 may be about 2000 Å to 5000 Å, the thickness of the first sub-water barrier layer 51-1 may be about 300 Å to 1000 Å, and the thickness of the second sub-water barrier layer 51-2 may be about 300 Å to 1000 Å. For example, the thickness of silicon nitride may be about 4500 Å, and the thickness of silicon oxynitride may be about 500 Å. For another example, the thickness of silicon nitride may be about 4700 Å, and the thickness of silicon oxynitride may be about 300 Å.

According to the present disclosure, a first encapsulation layer including a first sub-transition layer, a first sub-water barrier layer, a second sub-transition layer and a second sub-water barrier layer is provided. Wherein, the first sub-transition layer and the second sub-transition layer adopt silicon nitride with an adhesion of about 1.3N to 1.9N, the first sub-water barrier layer and the second sub-water barrier layer adopt silicon oxynitride with an adhesion of about 2.5N to 2.8N. In this way, the adhesion difference between film layers is less than 2N. Both the adhesion difference and the stress mismatch between the film layers are reduced, the peeling of the interface between the film layers is effectively avoided, and the reliability of the film encapsulation is ensured. The bending resistance and crimping ability of display substrates are improved, and the working reliability and service life of display substrates are increased.

The life comparison test shows that the failure time is 4 hours when the first composite encapsulation layer adopts SiON with a single film structure with a thickness of 10,000 Å. When the first composite encapsulation layer adopts silicon nitride SiNx with a single film structure with a thickness of 10,000 Å, the failure time is 24 hours. When the first composite encapsulation layer adopts a double-layer composite film structure of silicon nitride SiNx (9500 Å) and silicon oxide nitride SiON (500 Å), the failure time is 40 hours. When the first composite encapsulation layer adopts a four-layer composite film structure of silicon nitride SiNx (4500 Å)-silicon oxynitride SiON (500 Å)-silicon nitride SiNx (4500 Å)-silicon oxynitride SiON (500 Å), the failure time is 48 hours. When the first composite encapsulation layer adopts a four-layer composite film structure of silicon nitride SiNx (500 Å)-silicon oxynitride SiON (4500 Å)-silicon nitride SiNx (500 Å)-silicon oxynitride SiON (4500 Å), the failure time is 48 hours. X-Y or X-Y-X-Y refers to the film layers sequentially stacked on the cathode along the direction away from the substrate.

Because the adhesion of silicon oxynitride SiON is 2.5N to 2.8N, when SiON is directly formed on the cathode, the adhesion difference between SiON and the cathode is about 2.5N, and the adhesion difference between the two films is large, so there is a serious stress mismatch between the two films, and the interface between the cathode and SiON is easy to peel off, and the failure time is short. Because the adhesion of silicon nitride SiN is 1.3N to 1.9N, when silicon nitride SiN is directly formed on the cathode, the adhesion difference between silicon nitride SiN and cathode is about 1.3N, which is less than the adhesion difference between silicon oxide SiON and cathode, so the interface between cathode and silicon oxide SiON is not easy to peel off and the failure time is long.

For a two-layer composite film structure in which silicon nitride SiN is directly formed on the cathode and silicon oxynitride SiON is directly formed on the silicon nitride SiN, the adhesion difference between SiN and cathode is about 1.3N, the interface between the cathode and the silicon nitride SiN is not easy to peel off. The adhesion difference between the silicon nitride SiON and the silicon nitride SiN is about 1.1N, and the interface between the silicon nitride SiN and the silicon nitride SiON is not easy to peel off. Furthermore, the number of interfaces is increased, the adhesion of the first composite encapsulation layer is improved, and the failure time is greatly increased.

For the four-layer composite film structure of silicon nitride SiNx-silicon oxynitride SiON-silicon nitride SiNx-silicon oxynitride SiON, not only the adhesion difference between adjacent film layers is small, and the interface between adjacent film layers is not easy to peel off, but also the number of interfaces is further increased, and the overall adhesion of the first composite encapsulation layer is further improved, thus further increasing the failure time compared with the two-layer composite film structure.

Adhesion measurement shows that when a single silicon oxynitride SiON film is directly formed on the cathode, the overall adhesion of the silicon oxynitride SiON film is about 2.69N. When a four-layer composite film structure of silicon nitride SiNx (4500 Å)-silicon oxynitride SiON (500 Å)-silicon nitride SiNx (4500 Å)-silicon oxynitride SiON (500 Å) is formed on the cathode, the overall adhesion of the four-layer composite film is about 4.215N. Therefore, the composite film layer formed with silicon nitride SiNx as the adhesion transition layer can improve the overall adhesion of the first composite encapsulation layer and effectively avoid the peeling of the interface between the films.

In an exemplary embodiment, the first sub-transition layer, the first sub-water barrier layer, the second sub-transition layer and the second sub-water barrier layer may alternatively be made of other inorganic materials, and the effect of avoiding interface peeling between the film layers may also be achieved as long as the adhesion of the first sub-transition layer is between the cathode and the first sub-water barrier layer.

Figure 12:
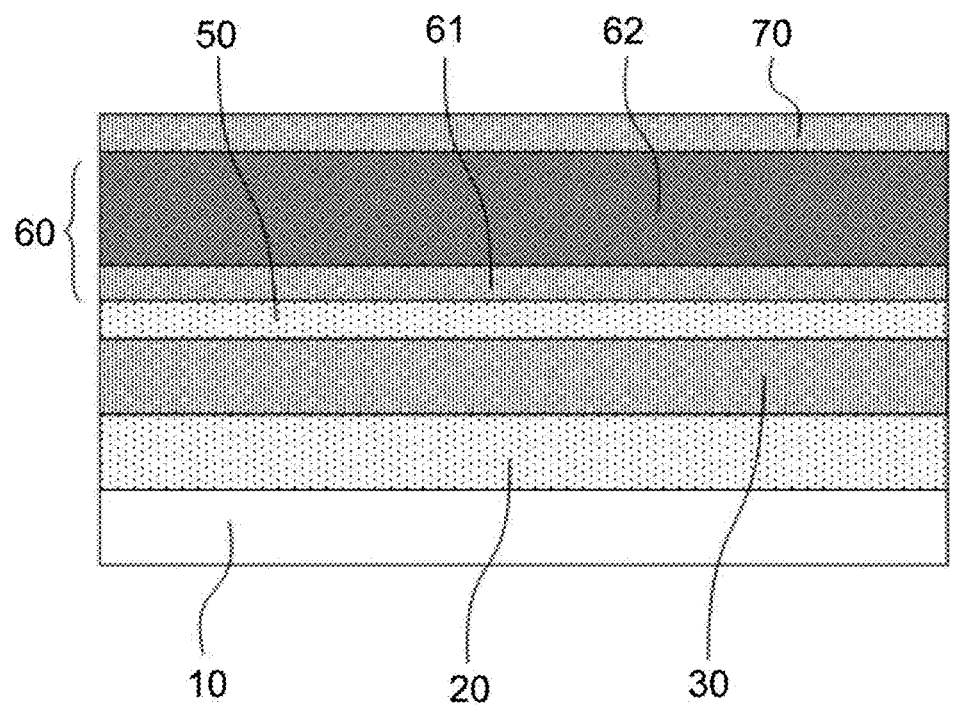
FIG. 12 is a schematic diagram of a structure of yet another display substrate according to an exemplary embodiment of the present disclosure.

FIG. 12 is a schematic diagram of a structure of yet another display substrate according to an exemplary embodiment of the present disclosure. As shown in FIG. 12, in an exemplary embodiment, the display substrate may include a substrate 10, a drive circuit layer 20 disposed on the substrate 10, a light emitting device 30 disposed on a side of the drive circuit layer 20 far away from the substrate 10, and an encapsulation structure layer disposed on the side of the light emitting device 30 away from the substrate 10. In an exemplary embodiment, the encapsulation structure layer may include a first composite encapsulation layer 50 disposed on a side of the light emitting device 30 away from the substrate 10, a second composite encapsulation layer 60 disposed on a side of the first composite encapsulation layer 50 away from the substrate 10, and a third composite encapsulation layer 70 disposed on a side of the second composite encapsulation layer 60 away from the substrate 10.

In an exemplary embodiment, the second composite encapsulation layer 60 may include a second transition layer and a first organic layer.

In an exemplary embodiment, the second composite encapsulation layer 60 may include a second transition layer 61 disposed on a side of the first composite encapsulation layer 50 away from the substrate 10 and a first organic layer 62 disposed on a side of the second transition layer 61 away from the substrate, and the third composite encapsulation layer 70 is disposed on a surface of the first organic layer 62 on a side away from the substrate 10.

In an exemplary embodiment, the adhesion of the second transition layer 61 is greater than that of the first composite encapsulation layer 50 but less than that of the first organic layer 62.

In an exemplary embodiment, the thickness of the second transition layer 61 may be about 100 Å to 5000 Å. The second transition layer 61 is configured to reduce the adhesion difference between the film layers and to reduce the stress mismatch between the film layers so as to avoid interface peeling between the film layers.

In an exemplary embodiment, the material of the first organic layer 62 having the stress cushioning function may include any one or more of the following: acrylate and epoxy, and the thickness may be about 1.0 μm to 3.0 μm.

In the exemplary embodiment, the adhesion of the acrylate and the epoxy is about 10N or more, and the adhesion of the first composite encapsulation layer 50 using the composite film layer structure is about 4N to 5N, so that the material of the second transition layer 61 may be a material having an adhesion of about 6N to 9N. In an exemplary embodiment, a material having an adhesion of about 6N to 9N may be achieved by adding an adhesion additive to silicon nitride or silicon oxynitride or changing deposition process parameters, which are well known in the art.

In an exemplary embodiment, because there is a certain gap in adhesion between the inorganic material film layer and the organic material film layer, the interface between the first encapsulation layer and the second encapsulation layer will be peeled off in use, resulting in encapsulation failure. The disclosure discloses a second composite encapsulation layer including a second transition layer and a first organic layer, wherein a second transition layer is arranged between the first composite encapsulation layer and the first organic layer. The adhesion of the second transition layer is greater than that of the first composite encapsulation layer, but less than that of the first organic layer. Both the adhesion difference and the stress mismatch between the film layers are reduced, the peeling of the interface between the film layers is effectively avoided, and the reliability of the film encapsulation is ensured.

In an exemplary embodiment, the second composite encapsulation layer may include a plurality of sub-transition layers and a plurality of sub-organic layers, minimizing the adhesion difference between the film layers and avoiding the peeling of the interface between the film layers to the maximum.

Figure 13:
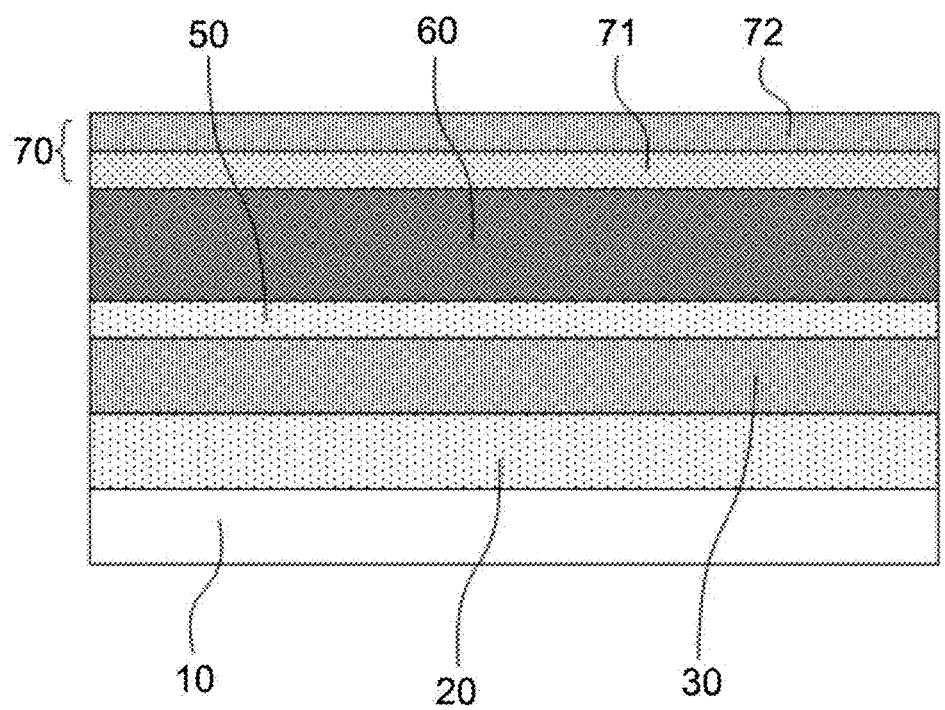
FIG. 13 is a schematic diagram of a structure of yet another display substrate according to an exemplary embodiment of the present disclosure.

FIG. 13 is a schematic diagram of a structure of yet another display substrate according to an exemplary embodiment of the present disclosure. As shown in FIG. 13, in an exemplary embodiment, the display substrate may include a substrate 10, a drive circuit layer 20 disposed on the substrate 10, a light emitting device 30 disposed on a side of the drive circuit layer 20 away from the substrate 10, and an encapsulation structure layer disposed on the side of the light emitting device 30 away from the substrate 10. In an exemplary embodiment, the encapsulation structure layer may include a first composite encapsulation layer 50 disposed on a side of the light emitting device 30 away from the substrate 10, a second composite encapsulation layer 60 disposed on a side of the first composite encapsulation layer 50 away from the substrate 10, and a third composite encapsulation layer 70 disposed on a side of the second composite encapsulation layer 60 away from the substrate 10.

In an exemplary embodiment, the third composite encapsulation layer 70 may include a third transition layer and a third water barrier layer.

In an exemplary embodiment, the third composite encapsulation layer 70 may include a third transition layer 71 disposed on a side of the second composite encapsulation layer 60 away from the substrate 10 and a third water barrier layer 72 as a third encapsulation layer disposed on a side of the third transition layer 71 away from the substrate.

In an exemplary embodiment, the adhesion of the third transition layer 71 is less than that of the second composite encapsulation layer 60 but greater than that of the third water barrier layer 72.

In an exemplary embodiment, the thickness of the third transition layer 71 may be about 100 Å to 5000 Å, and the thickness of the third water barrier layer 72 may be about 6000 Å to 12000 Å. The third transition layer 71 is configured to reduce the adhesion difference between the film layers and to reduce the stress mismatch between the film layers so as to avoid interface peeling between the film layers. The third water barrier layer 72 is configured to isolate water and oxygen so as to improve the water and oxygen barrier function and ensure that external water vapor cannot enter the light emitting device.

In an exemplary embodiment, the third water barrier layer 72 may be a single-layer film layer structure using silicon nitride, silicon oxynitride, or silicon carbonitride, or a composite film layer structure using the above materials, the adhesion of the single-layer film layer structure is about 2N to 3N, and the adhesion of the composite film layer structure is about 4N to 5N. Because the adhesion of the second composite encapsulation layer 60 is about 10N or more, the material of the third transition layer 71 may be a material having an adhesion of about 6N to about 9N. In an exemplary embodiment, a material having an adhesion of about 6N to 9N may be achieved by adding an adhesion additive to silicon nitride or silicon oxynitride or changing deposition process parameters, which are well known in the art.

In an exemplary embodiment, because there is a certain gap in adhesion between the inorganic material film and the organic material film, the interface between the second encapsulation layer and the third encapsulation layer will be peeled off in use, resulting in encapsulation failure. The disclosure provides a third composite encapsulation layer including a third transition layer and a third water barrier layer, wherein the third transition layer is arranged between the second composite encapsulation layer and the third water barrier layer. The adhesion of the third transition layer is smaller than that of the second encapsulation layer, but greater than that of the third water barrier layer. Both the adhesion difference and the stress mismatch between the film layers are reduced, the peeling of the interface between the film layers is effectively avoided, and the reliability of the film encapsulation is ensured.

In an exemplary embodiment, the third composite encapsulation layer may include a plurality of sub-transition layers and a plurality of sub-water barrier layers, minimizing the adhesion difference between the film layers and avoiding the peeling of the interface between the film layers to the maximum.

In exemplary embodiments, various technical solutions of the display substrate of the exemplary embodiments of the present disclosure may be formed by any combination of the foregoing embodiments. For example, in the direction of the cathode away from the substrate, The encapsulation structure layer may include: a first transition layer, a first encapsulation layer, a second transition layer, a second encapsulation layer and a third encapsulation layer which are stacked, or includes a first transition layer, a first encapsulation layer, a second encapsulation layer, a third transition layer and a third encapsulation layer which are stacked, or includes a first encapsulation layer, a second transition layer, a second encapsulation layer, a third transition layer and a third encapsulation layer which are stacked, or includes a first transition layer, a first encapsulation layer, a second transition layer, a second encapsulation layer, a third transition layer and a third encapsulation layer which are stacked. In an exemplary embodiment, at least one transition layer may include a plurality of sub-transition layers, at least one encapsulation layer may include a plurality of sub-encapsulation layers, a plurality of sub-transition layers and a plurality of sub-encapsulation layers. By various combinations of the plurality of sub-transition layers and the plurality of sub-encapsulation layers, the adhesion difference between the film layers is minimized, and the peeling of the interface between the film layers is avoided to the maximum.

The present disclosure further provides a preparation method for a display substrate. In an exemplary embodiment, the manufacturing method includes:

S1, forming a light emitting structure layer on a base substrate; and

S2, forming an encapsulation structure layer on the emitting structure layer, wherein the encapsulation structure layer includes an encapsulation layer and at least one transition layer, a side of the transition layer adjacent to the substrate is in contact with a first side film layer, the side of the transition layer away from the substrate is in contact with a second side film layer, and the adhesion of the at least one transition layer is greater than the adhesion of one of the first side film layer and the second side film layer and less than the adhesion of the other of the first side film layer and the second side film layer.

In an exemplary embodiment, the emitting structure layer may include a drive circuit layer disposed on a substrate and a light emitting device disposed on a side of the drive circuit layer away from the substrate.

In an exemplary embodiment, step S2 may include:
forming a first transition layer on a cathode of the emitting structure layer, wherein the adhesion of the first transition layer is greater than the adhesion of the cathode of the emitting structure layer; forming a first encapsulation layer on the first transition layer, wherein the adhesion of the first encapsulation layer is greater than the adhesion of the first transition layer; forming a second encapsulation layer and a third encapsulation layer in sequence on the first encapsulation layer.

In an exemplary embodiment, step S2 may include:
forming a first encapsulation layer on the cathode of the emitting structure layer; forming a second transition layer on the first encapsulation layer, wherein the adhesion of the second transition layer is greater than the adhesion of the first encapsulation layer; and sequentially forming a second encapsulation layer and a third encapsulation layer on the second transition layer, wherein the adhesion of the second encapsulation layer is greater than the adhesion of the second transition layer.

In an exemplary embodiment, step S2 may include:
sequentially forming a first encapsulation layer and a second encapsulation layer on the cathode of the emitting structure layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer.

In an exemplary embodiment, step S2 may include:
forming a first transition layer on a cathode of the emitting structure layer, wherein the adhesion of the first transition layer is greater than the adhesion of the cathode of the emitting structure layer; forming a first encapsulation layer on the first transition layer, wherein the adhesion of the first encapsulation layer is greater than the adhesion of the first transition layer; forming a second transition layer on the first encapsulation layer, wherein the adhesion of the second transition layer is greater than the adhesion of the first encapsulation layer; and sequentially forming a second encapsulation layer and a third encapsulation layer on the second transition layer, wherein the adhesion of the second encapsulation layer is greater than the adhesion of the second transition layer.

In an exemplary embodiment, step S2 may include:
forming a first transition layer on a cathode of the emitting structure layer, wherein the adhesion of the first transition layer is greater than the adhesion of the cathode of the emitting structure layer; sequentially forming a first encapsulation layer and a second encapsulation layer on the first transition layer, wherein the adhesion of the first encapsulation layer is greater than the adhesion of the first transition layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer.

In an exemplary embodiment, step S2 may include:
forming a first encapsulation layer on the cathode of the emitting structure layer; forming a second transition layer on the first encapsulation layer, wherein the adhesion of the second transition layer is greater than the adhesion of the first encapsulation layer; and forming a second encapsulation layer on the second transition layer, wherein the adhesion of the second encapsulation layer is greater than the adhesion of the second transition layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer.

In an exemplary embodiment, step S2 may include:

forming a first transition layer on a cathode of the emitting structure layer, wherein the adhesion of the first transition layer is greater than the adhesion of the cathode of the emitting structure layer; forming a first encapsulation layer on the first transition layer, wherein the adhesion of the first encapsulation layer is greater than the adhesion of the first transition layer; forming a second transition layer on the first encapsulation layer, wherein the adhesion of the second transition layer is greater than the adhesion of the first encapsulation layer; and forming a second encapsulation layer on the second transition layer, wherein the adhesion of the second encapsulation layer is greater than the adhesion of the second transition layer; forming a third transition layer on the second encapsulation layer, wherein the adhesion of the third transition layer is smaller than the adhesion of the second encapsulation layer; and forming a third encapsulation layer on the third transition layer, wherein the adhesion of the third encapsulation layer is less than the adhesion of the third transition layer.

In an exemplary embodiment, the first transition layer includes a first sub-transition layer and a second sub-transition layer, and the first encapsulation layer includes a first water barrier layer; the forming of a first transition layer and a first encapsulation layer on the cathode of the emitting structure layer includes:

forming a first sub-transition layer on a cathode of the emitting structure layer, wherein the adhesion of the first sub-transition layer is greater than the adhesion of the cathode of the emitting structure layer;

forming a second sub-transition layer on the first sub-transition layer, wherein the adhesion of the second sub-transition layer is greater than the adhesion of the first sub-transition layer;

forming a first water barrier layer on the second sub-transition layer, wherein the adhesion of the first water barrier layer is greater than the adhesion of the second sub-transition layer.

In an exemplary embodiment, the first transition layer includes a first sub-transition layer and a second sub-transition layer, and the first encapsulation layer includes a first water barrier layer and a second sub-water barrier layer; the forming of a first transition layer and a first encapsulation layer on the cathode of the emitting structure layer includes:

forming a first sub-transition layer on a cathode of the emitting structure layer, wherein the adhesion of the first sub-transition layer is greater than the adhesion of the cathode of the emitting structure layer;

forming a first sub-water barrier layer on the first sub-transition layer, wherein the adhesion of the first sub-water barrier layer is greater the adhesion of the first sub-transition layer;

forming a second sub-transition layer on the first sub-water barrier layer; and forming a second sub-water barrier layer on the second sub-transition layer, wherein the adhesion of the second sub-water barrier layer is greater than the adhesion of the second sub-transition layer.

In an exemplary embodiment, the density of the first sub-transition layer is less than the density of the first sub-water barrier layer; or, the modulus of the first sub-transition layer is less than the modulus of the first sub-water barrier layer; or, the hardness of the first sub-transition layer is less than the hardness of the first sub-water barrier layer; the material of the first sub-transition layer includes silicon carbonitride.

The present application provides method for preparing a display substrate. By providing a transition layer in the encapsulation structure layer, the adhesion of one of the two film layers contacted by at least one transition layer is greater than that of the transition layer, and the adhesion of the other film layer is smaller than that of the transition layer. Both the adhesion difference and the stress mismatch between the film layers are reduced, the peeling of the interface between the film layers is effectively avoided, and the reliability of the film encapsulation is ensured. In this way, not only can the reliability of the thin film encapsulation be greatly improved, but also the bending resistance and curling ability of the display substrate can be greatly increased, which provides a guarantee for a display device with a long service life requirement. The preparation method for the display substrate of the exemplary embodiment of the present disclosure has good process compatibility, simple process realization, easy implementation, high production efficiency, and a low production cost.

The present disclosure further provides a display apparatus including the display substrate in the aforementioned embodiments. The display apparatus may be any product or component with a display function, such as a mobile phone, a tablet computer, a television, a display, a laptop computer, a digital photo frame, or a navigator.

Although the embodiments disclosed in the present disclosure are as above, the described contents are only embodiments used for convenience of understanding the present disclosure and are not intended to limit the present disclosure. Any skilled in the art to which the present disclosure pertains, without departing from the spirit and scope disclosed in the present disclosure, may make any modifications and changes in the form and details of the implementation. However, the scope of patent protection of the present application should still be subject to the scope defined by the appended claims.

The invention claimed is:

1. A display substrate, comprising: a substrate, an emitting structure layer disposed on the substrate, and a encapsulation structure layer disposed on a side of the emitting structure layer away from the substrate, wherein the encapsulation structure layer comprises an encapsulation layer and at least one transition layer, a side of the transition layer adjacent to the substrate is in contact with a first side film layer, a side of the transition layer away from the substrate is in contact with a second side film layer, and an adhesion of the at least one transition layer is greater than an adhesion of one of the first side film layer and the second side film layer and less than an adhesion of the other of the first side film layer and the second side film layer, wherein the transition layer comprises a first transition layer, and wherein the first side film layer is a cathode of the emitting structure layer; the second side film layer is a first water barrier layer of the encapsulation structure layer; and the adhesion of the first transition layer is greater than adhesion of the cathode and less than adhesion of the first water barrier layer.

2. A display apparatus, comprising the display substrate according to claim 1.

3. The display substrate according to claim 1, wherein the encapsulation structure layer comprises a first encapsulation layer, a second encapsulation layer and a third encapsulation layer arranged in sequence along a direction away from the substrate, the transition layer further comprises any one or more of the following: a first transition layer, a second transition layer and a third transition layer, the first transition layer is arranged between the cathode of the emitting structure layer and the first encapsulation layer, the second transition layer is arranged between the first encapsulation layer and the second encapsulation layer, and the third transition layer is arranged between the second encapsulation layer and the third encapsulation layer.

4. The display substrate according to claim 3, wherein an adhesion of the second transition layer is greater than an adhesion of the first encapsulation layer, and the adhesion of the second transition layer is less than an adhesion of the second encapsulation layer.

5. The display substrate according to claim 3, wherein an adhesion of the third transition layer is less than an adhesion of the second encapsulation layer, and the adhesion of the third transition layer is greater than an adhesion of the third encapsulation layer.

6. The display substrate according to claim 3, wherein the first transition layer comprises a first sub-transition layer and a second sub-transition layer, and the first encapsulation layer comprises the first water barrier layer;

the first sub-transition layer is disposed on a side of the cathode of the emitting structure layer away from the substrate, and an adhesion of the first sub-transition layer is greater than an adhesion of the cathode of the emitting structure layer; an second sub-transition layer is disposed on a side of the first sub-transition layer away from the substrate, and an adhesion of the second sub-transition layer is greater than the adhesion of the first sub-transition layer; the first water barrier layer is disposed on a side of the second sub-transition layer away from the substrate, and an adhesion of the first water barrier layer is greater than the adhesion of the second sub-transition layer.

7. The display substrate according to claim 6, wherein a density of the first sub-transition layer is less than a density of the first sub-water barrier layer; or, a modulus of the first sub-transition layer is less than a modulus of the first sub-water barrier layer; or, a hardness of the first sub-transition layer is less than a hardness of the first sub-water barrier layer.

8. The display substrate according to claim 3, wherein the first transition layer comprises a first sub-transition layer and a second sub-transition layer, and the first encapsulation layer comprises a first sub-water barrier layer and a second sub-water barrier layer;

the first sub-transition layer is disposed on a side of the cathode of the emitting structure layer away from the substrate, and an adhesion of the first sub-transition layer is greater than an adhesion of the cathode of the emitting structure layer; the first sub-water barrier layer is disposed on a side of the first sub-transition layer away from the substrate, and an adhesion of the first sub-water barrier layer is greater than the adhesion of the first sub-transition layer; the second sub-transition layer is disposed on a side of the first sub-water barrier layer away from the substrate; the second sub-water barrier layer is disposed on a side of the second sub-transition layer away from the substrate, and an adhesion of the second sub-water barrier layer is greater than an adhesion of the second sub-transition layer.

9. The display substrate according to claim 8, wherein a density of the first sub-transition layer is less than a density of the first sub-water barrier layer; or, a modulus of the first sub-transition layer is less than a modulus of the first sub-water barrier layer; or, a hardness of the first sub-transition layer is less than a hardness of the first sub-water barrier layer.

10. A preparation method for a display substrate, comprising:

forming an emitting structure layer on a substrate; and forming an encapsulation structure layer on the emitting structure layer, wherein the encapsulation structure layer comprises an encapsulation layer and at least one transition layer, a side of the transition layer adjacent to the substrate is in contact with a first side film layer, a side of the transition layer away from the substrate is in contact with a second side film layer, and an adhesion of the at least one transition layer is greater than an adhesion of one of the first side film layer and the second side film layer and less than an adhesion of the other of the first side film layer and the second side film layer, wherein forming the encapsulation structure layer on the emitting structure layer comprises:

forming a first transition layer of the at least one transition layer on a cathode of the emitting structure layer, forming a first encapsulation layer of the encapsulation layer on the first transition layer, and wherein the first side film layer is the cathode of the emitting structure layer; the second side film layer is a first water barrier layer of the first encapsulation layer; and the adhesion of the first transition layer is greater than adhesion of the cathode and less than adhesion of the first water barrier layer.

11. The preparation method according to claim 10, wherein forming the encapsulation structure layer on the emitting structure layer further comprises:

forming a second transition layer on the first encapsulation layer, wherein an adhesion of the second transition layer is greater than the adhesion of the first encapsulation layer; sequentially forming a second encapsulation layer and a third encapsulation layer on the second transition layer, wherein an adhesion of the second encapsulation layer is greater than the adhesion of the second transition layer.

12. The preparation method according to claim 11, wherein the first transition layer comprises a first sub-transition layer and a second sub-transition layer, and the first encapsulation layer comprises the first water barrier layer, wherein forming the first transition layer and the first encapsulation layer on the cathode of the emitting structure layer comprises:

forming the first sub-transition layer on the cathode of the emitting structure layer, wherein an adhesion of the first sub-transition layer is greater than the adhesion of the cathode of the emitting structure layer;

forming the second sub-transition layer on the first sub-transition layer, wherein an adhesion of the second sub-transition layer is greater than the adhesion of the first sub-transition layer; and forming the first water barrier layer on the second sub-transition layer, wherein an adhesion of the first water barrier layer is greater than the adhesion of the second sub-transition layer.

13. The preparation method according to claim 11, wherein the first transition layer comprises a first sub-transition layer and a second sub-transition layer, and the first encapsulation layer comprises a first sub-water barrier layer and a second sub-water barrier layer, wherein forming the first transition layer and the first encapsulation layer on the cathode of the emitting structure layer comprises:

forming the first sub-transition layer on the cathode of the emitting structure layer, wherein an adhesion of the first sub-transition layer is greater than the adhesion of the cathode of the emitting structure layer;

forming the first sub-water barrier layer on the first sub-transition layer, wherein an adhesion of the first sub-water barrier layer is greater the adhesion of the first sub-transition layer;

forming the second sub-transition layer on the first sub-water barrier layer; and forming the second sub-water barrier layer on the second sub-transition layer, wherein an adhesion of the second sub-water barrier layer is greater than an adhesion of the second sub-transition layer.

\* \* \* \* \*